United States Patent
Fukuzawa et al.

(10) Patent No.: US 10,641,409 B2
(45) Date of Patent: May 5, 2020

(54) DRIVER AND DRIVER-INTEGRATED ELECTRIC ACTUATOR

(71) Applicant: HITACHI AUTOMOTIVE SYSTEMS, LTD., Ibaraki (JP)

(72) Inventors: Takayuki Fukuzawa, Hitachinaka (JP); Yoshio Kawai, Hitachinaka (JP); Yujiro Kaneko, Hitachinaka (JP)

(73) Assignee: HITACHI AUTOMOTIVE SYSTEMS, LTD., Ibaraki (JP)

( * ) Notice: Subject to any disclaimer, the term of this patent is extended or adjusted under 35 U.S.C. 154(b) by 255 days.

(21) Appl. No.: 15/743,563

(22) PCT Filed: Jul. 27, 2016

(86) PCT No.: PCT/JP2016/071949
§ 371 (c)(1),
(2) Date: Jan. 10, 2018

(87) PCT Pub. No.: WO2017/038315
PCT Pub. Date: Mar. 9, 2017

(65) Prior Publication Data
US 2018/0202571 A1    Jul. 19, 2018

(30) Foreign Application Priority Data

Aug. 31, 2015 (JP) ................... 2015-169978

(51) Int. Cl.
*H05K 7/12* (2006.01)
*H01F 7/06* (2006.01)
(Continued)

(52) U.S. Cl.
CPC .............. *F16K 31/06* (2013.01); *F16K 49/00* (2013.01); *H01F 7/064* (2013.01); *H01F 7/16* (2013.01); *H02K 9/22* (2013.01); *H02K 11/33* (2016.01); *H02K 33/02* (2013.01); *H05K 7/12* (2013.01); *H02K 11/022* (2013.01)

(58) Field of Classification Search
None
See application file for complete search history.

(56) References Cited

U.S. PATENT DOCUMENTS 6,099,325 A * 8/2000 Parkhill ............... H01R 9/2466
361/707
7,989,997 B2 * 8/2011 Hashimoto .......... B62D 5/0406
310/68 D
(Continued)

FOREIGN PATENT DOCUMENTS

JP    2000-307277 A    11/2000
JP    2005-032912 A    2/2005
(Continued)

OTHER PUBLICATIONS

Extended European Search Report dated Aug. 5, 2019 for the European Patent Application No. 16841347.4.
(Continued)

*Primary Examiner* — Courtney L Smith
(74) *Attorney, Agent, or Firm* — Volpe and Koenig, P.C.

(57) ABSTRACT

Provided are a driver and a driver-integrated electric actuator that can suppress a temperature rise of the driver integrated with an electric actuator. A driver circuit of an electric actuator-integrated driver controls a current to be supplied to an electric actuator. A metal member (heat-conducting portion) conducts heat generated in the driver circuit. A driver sealing portion is fixed to the electric actuator and seals the driver circuit and the metal member. The metal member is extended to the electric actuator.

23 Claims, 12 Drawing Sheets

(51) Int. Cl.
  *F16K 31/06*   (2006.01)
  *H02K 11/33*   (2016.01)
  *H02K 9/22*    (2006.01)
  *H02K 33/02*   (2006.01)
  *F16K 49/00*   (2006.01)
  *H01F 7/16*    (2006.01)
  *H02K 11/22*   (2016.01)

(56) References Cited

U.S. PATENT DOCUMENTS

| | | | | |
|---|---|---|---|---|
| 8,339,801 B2* | 12/2012 | Tominaga | ............ | B62D 5/0406 |
| | | | | 361/752 |
| 2010/0148894 A1* | 6/2010 | Ohashi | ................... | H02K 55/02 |
| | | | | 335/216 |
| 2011/0013365 A1 | 1/2011 | Oota | | |
| 2013/0058044 A1* | 3/2013 | Watanabe | .............. | H05K 5/006 |
| | | | | 361/714 |
| 2013/0136586 A1* | 5/2013 | Kato | ....................... | F04D 13/06 |
| | | | | 415/191 |
| 2014/0225482 A1 | 8/2014 | Hara et al. | | |
| 2014/0239780 A1* | 8/2014 | Tanaka | ................. | B62D 5/0409 |
| | | | | 310/68 D |
| 2015/0333603 A1 | 11/2015 | von Willich et al. | | |

FOREIGN PATENT DOCUMENTS

| | | |
|---|---|---|
| JP | 2007-315269 A | 12/2007 |
| JP | 2013-113272 A | 6/2013 |
| JP | 2013-147050 A | 8/2013 |
| JP | 2014-152882 A | 8/2014 |
| WO | 2014/090946 A2 | 6/2014 |

OTHER PUBLICATIONS

Chinese Office Action dated Aug. 30, 2019 for the Chinese Patent Application No. 201680041238.6.
International Search Report dated Oct. 25, 2016 of International Application No. PCT/JP2016/071949.

* cited by examiner

CROSS-SECTION A-A VIEW

DRIVER AND DRIVER-INTEGRATED ELECTRIC ACTUATOR

TECHNICAL FIELD

The present invention relates to a driver and a driver-integrated electric actuator.

BACKGROUND ART

A solenoid valve, which is one of electric actuators, for example, used in hydraulic control or the like, has an electromagnetic coil therein and has a structure in which a plunger is opened and closed by energizing the electromagnetic coil (for example, see PTL 1). Here, the electric actuator is controlled by, for example, an electrically-connected electronic control device.

CITATION LIST

Patent Literature

PTL 1: JP 2014-152882 A

SUMMARY OF INVENTION

Technical Problem

Along with recent improvement in fuel efficiency and stricter emission regulations, the adoption of electric actuators capable of highly accurate hydraulic control has increased, and the number of cases of mounting the electric actuator has also increased. In addition, there is a demand for a highly accurate current detection function in the electronic control device for controlling the electric actuator while demanding miniaturization in order for comfort in a cabin space so that the proportion occupied by an electric actuator control circuit in the entire circuit has increased in an electronic substrate mounted in the electronic control device, which is one of factors that hinder the miniaturization.

There is a method of integrating an electric actuator control function in order for miniaturization and cost reduction of the electronic control device, and the present invention is characterized by mounting a driver including the functionally-integrated driver circuit on a main body side, for example, a connection part or the like of an electric actuator instead of mounting the driver on an electronic substrate in the electronic control device, that is, being an electric actuator-integrated driver.

However, there is a case where the electric actuator is mounted in high-temperature environment, and further, an internal heat generator, for example, a motor and an electromagnetic coil, inside the electric actuator also generates heat during energization so that the inside of the electric actuator becomes high temperature. That is, the driver integrated with the electric actuator in the high temperature environment is also exposed to the high temperature environment, and there is a possibility that the driver exceeds heat resistant temperature so that the electric actuator causes malfunction or the like unless the heat generated from the driver is suppressed. Although there is a measure to improve the heat-resistant temperature of the driver, the cost increases.

An object of the present invention is to provide a driver and a driver-integrated electric actuator that can suppress a temperature rise of a driver integrated with an electric actuator.

Solution to Problem

In order to achieve the above-described object, the present invention includes: a driver circuit that controls a current to be supplied to an electric actuator; a heat-conducting portion that mounts the driver circuit and conducts heat generated in the driver circuit; and a sealing portion that is fixed to the electric actuator and seals the driver circuit and the heat-conducting portion, in which the heat-conducting portion is extended to the electric actuator.

Advantageous Effects of Invention

According to the present invention, it is possible to suppress the temperature rise of the driver integrated with the electric actuator. Other objects, configurations, and effects which have not been described above become apparent from embodiments to be described hereinafter.

DESCRIPTION OF EMBODIMENTS

Figure 1:
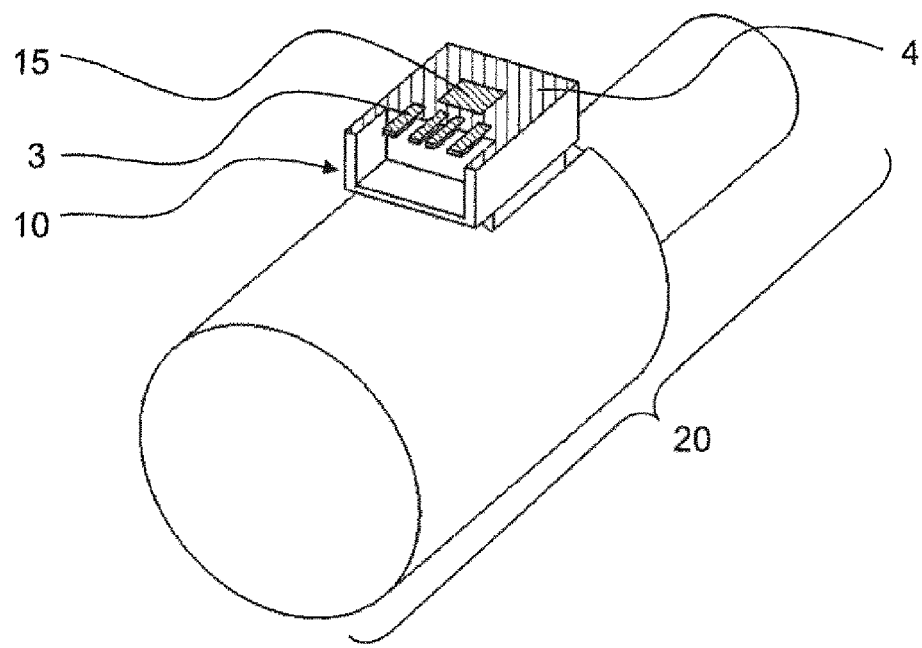
FIG. 1 is a cross-sectional view illustrating an example of a basic configuration of electric actuator-integrated drivers according to first to tenth embodiments of the present invention.

Hereinafter, electric actuator-integrated drivers according to the first to tenth embodiments of the present invention will be described in detail with reference to the drawings. Incidentally, the same reference numerals indicate the same parts in each drawing.

FIG. 1 is a cross-sectional view illustrating an example of a basic configuration of the electric actuator-integrated drivers according to the first to tenth embodiments of the present invention.

As being well-known, an actuator is a general term for a mechanism that converts input energy into a mechanical motion, and is used in various places. There are various types of actuators, such as a hydraulic actuator, an electric actuator, a linear actuator, and a rotary actuator, depending on a motive power source, an operation direction, and the like, and shapes and the like thereof are not limited to one.

As illustrated in FIG. 1, an electric actuator 20 operates using electric energy as the motive power source, and is integrated with an electric actuator-integrated driver 15 for controlling the actuator 20. The electric actuator-integrated driver 15 has a driver circuit (for example, a switching circuit including a switching element) that energizes a drive current to the electric actuator 20 based on an external input signal.

In other words, the driver circuit controls the current supplied to the electric actuator 20.

The input signal is transmitted from a terminal 3 for connection with an external wiring via a plurality of wire bonding (not illustrated) that electrically connect the terminal 3 and the electric actuator-integrated driver 15.

A driver sealing portion 4 integrally seals the electric actuator-integrated driver 15, the terminal 3, and the plurality of wire bonding, and is integrated with the electric actuator 20. The driver sealing portion 4 is molded using, for example, epoxy resin or the like having excellent heat resistance.

First Embodiment

Figure 2:
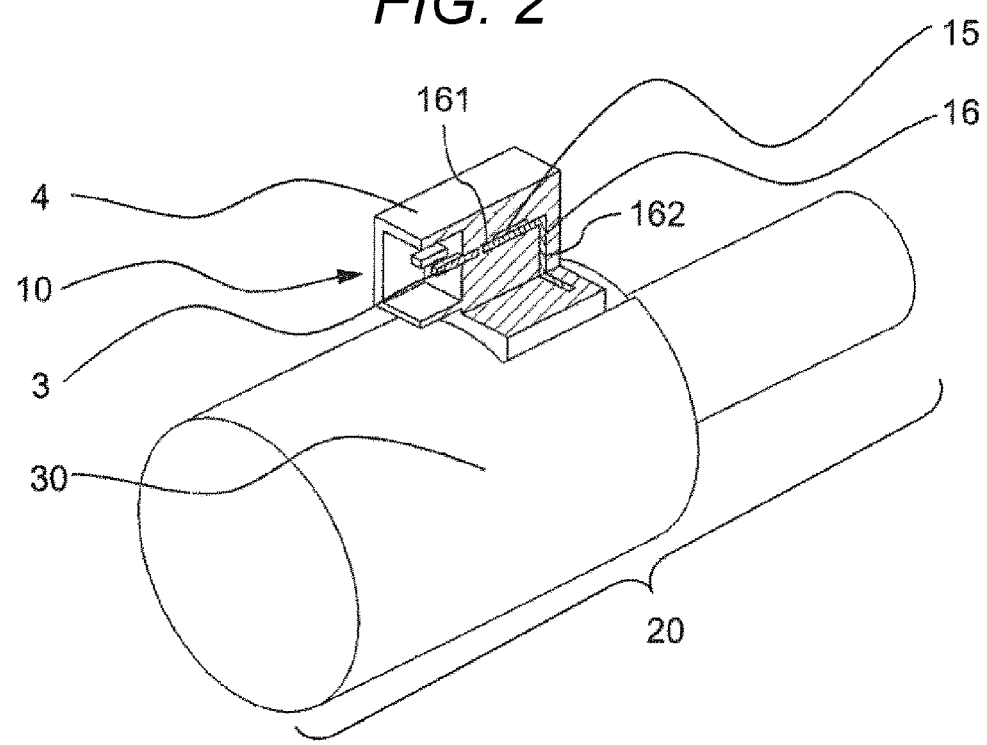
FIG. 2 is a cross-sectional view illustrating a heat dissipation structure of the electric actuator-integrated driver according to the first embodiment of the present invention.

FIG. 2 illustrates the first embodiment of the present invention. To be specific, FIG. 2 is a cross-sectional view illustrating a heat dissipation structure of the electric actuator-integrated driver of the first embodiment of the present invention.

The present embodiment has a structure in which a metal member 16 mounting the electric actuator-integrated driver 15 is extended to the actuator 20 side. Heat generated from the electric actuator-integrated driver 15 is efficiently transmitted to the metal member 16 having high thermal conductivity, and the metal member 16 is bent and extended to a cooling part of the actuator (for example, a part in contact with a cooling medium) or the vicinity of a heat dissipation destination of a metal part having high thermal conductivity. Thus, it is possible to improve the thermal conductivity of a heat dissipation path from the electric actuator-integrated driver 15 to the heat dissipation destination, and further, to improve heat dissipation performance of the electric actuator-integrated driver 15.

In other words, the metal member 16 (heat-conducting portion) mounts the driver circuit and conducts the heat generated in the driver circuit. The metal member 16 is extended to the electric actuator 20. To be specific, the metal member 16 mounts the driver circuit, and includes a part 161 extending in an axial direction of the electric actuator 20 and a part 162 extending from one end of the part 161 in a direction crossing an axis of the electric actuator 20 (specifically, in a vertical direction) as illustrated in FIG. 2.

Although there is a structure that allows the heat dissipation path to escape to an external harness through the terminal 3, it is necessary to suppress a temperature rise caused by energization as the temperature of the external harness rises due to heat dissipation. Thus, there is a problem of lowering the maximum amount of the current caused to flow through the external harness, and there is a possibility of causing a decrease in accuracy.

On the other hand, it is possible to improve the heat dissipation performance of the electric actuator-integrated driver 15 without increasing the amount of heat dissipation to the external harness according to the present embodiment.

In addition, it is possible to dissipate the heat by extending the mounted metal member 16 to the heat dissipation destination of the electric actuator 20 without depending on a mounting position of the electric actuator-integrated driver 15. It is also possible to mount the metal member 16 at a position away from an internal heat generator 30 for the purpose of avoiding the heat from the internal heat generator 30 of the electric actuator, for example, the motor or the electromagnetic coil. In addition, it is also possible to shorten a bonding length at the time of arranging the electric actuator-integrated driver 15 in the vicinity of the terminal 3 and connecting the electric actuator-integrated driver 15 and the terminal 3 by wire bonding.

The electric actuator-integrated driver 15 and the metal member 16 are bonded to each other by, for example, a die bonding material having high thermal conductivity. As the metal member 16, for example, a copper alloy or the like that has excellent thermal conductivity and is easily processed is preferable. As the resin material used for the driver sealing portion 4 that seals the electric actuator-integrated driver 15, the metal member 16, and the like, it is desirable to use a material that has high heat resistance and good adhesion to silicon, metal, a dissimilar resin material, and the like which are materials of parts to be sealed.

Here, the driver sealing portion 4 is fixed to the electric actuator 20 and seals the driver circuit and the metal member (heat-conducting portion). Incidentally, a connector housing 10, which holds the terminal 3 to be connected to the external wiring (external harness) and is fitted to an external connector, is formed in the driver sealing portion 4 in the example of FIG. 2.

As described above, it is possible to suppress the temperature rise of the driver integrated with the electric actuator according to the present embodiment. In addition, it is possible to suppress manufacturing cost and an increase in size.

Second Embodiment

Figure 3:
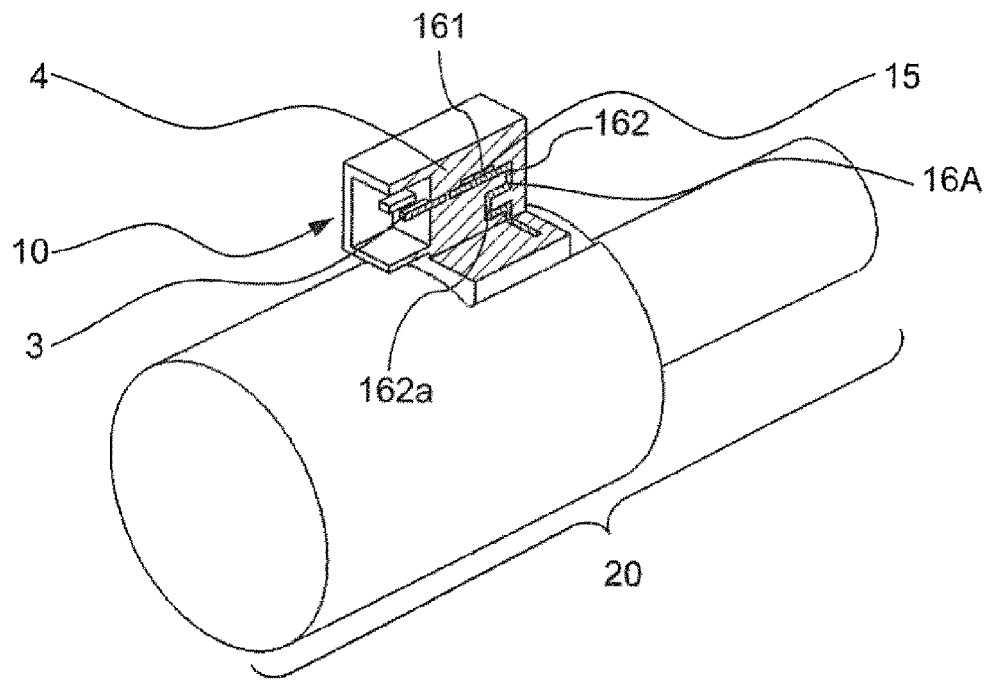
FIG. 3 is a cross-sectional view illustrating a heat dissipation structure of the electric actuator-integrated driver according to the second embodiment of the present invention.
Figure 4:
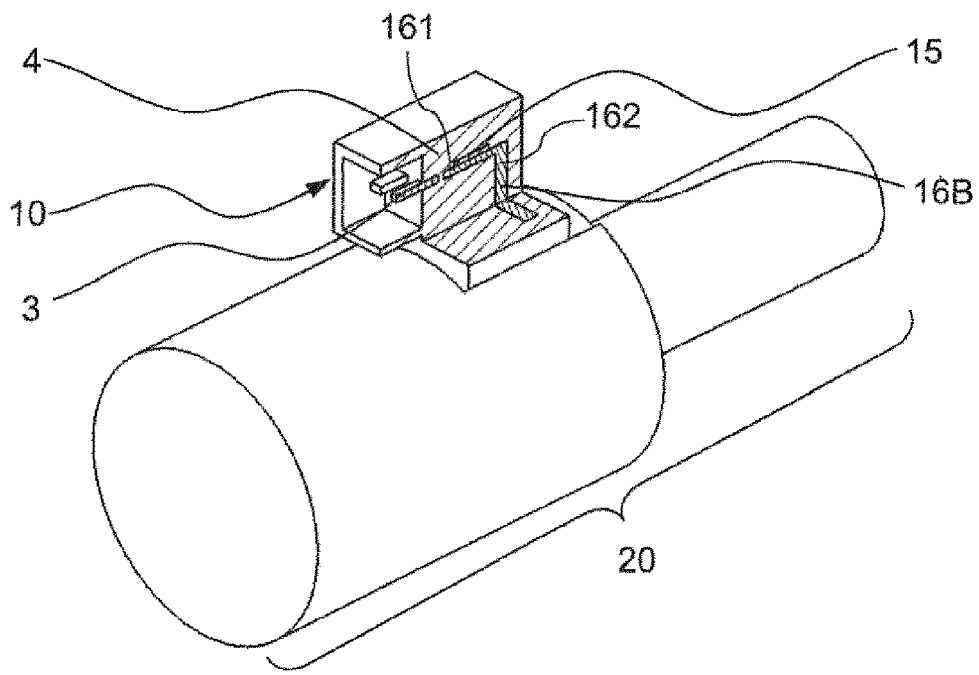
FIG. 4 is a cross-sectional view illustrating a heat dissipation structure having another shape of the electric actuator-integrated driver according to the second embodiment of the present invention.
Figure 5:
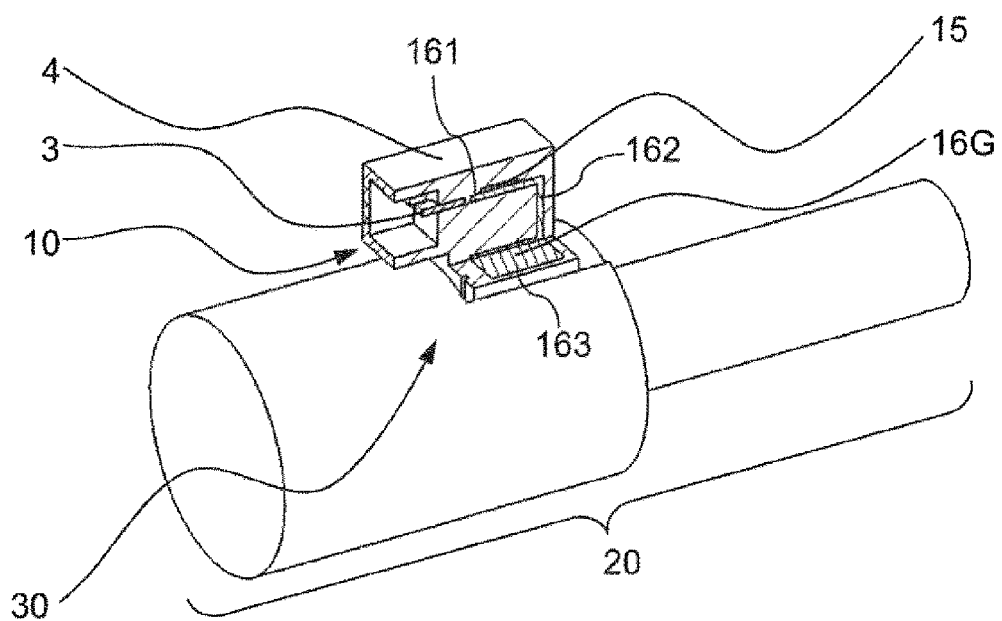
FIG. 5 is a cross-sectional view illustrating a heat dissipation structure having still another shape of the electric actuator-integrated driver according to the second embodiment of the present invention.

FIGS. 3, 4, and 5 illustrate the second embodiment of the present invention. Specifically, FIG. 3 is a cross-sectional view illustrating a heat dissipation structure of the electric actuator-integrated driver of the second embodiment of the present invention. FIG. 4 is a cross-sectional view illustrating a heat dissipation structure having another shape of the electric actuator-integrated driver according to the second embodiment of the present invention. FIG. 5 is a cross-sectional view illustrating a heat dissipation structure having still another shape of the electric actuator-integrated driver according to the second embodiment of the present invention.

The metal member 16 mounting the electric actuator-integrated driver 15 in FIG. 1 has an L shape in the present embodiment, but may have a shape as a rectangle-shaped metal member 16A obtained by utilizing bending of a press as illustrated in FIG. 3, for example, or a thick metal member 16B obtained by thickening a partial wall thickness as illustrated in FIG. 4, for example.

In other words, the part 162 of the metal member (heat-conducting portion) may have a U-shaped bent part 162a as illustrated in FIG. 3. In addition, the part 162 of the metal member (heat-conducting portion) may be thicker than the part 161 of the metal member as illustrated in FIG. 4.

In addition, a distal end-expanded metal member 16G obtained by increasing the area of a distal end of a metal member extended to the actuator 20 may be used as illustrated in FIG. 5.

In other words, the metal member (heat-conducting portion) may further include a part 163 extending in an axial direction of the electric actuator 20 from one end of the part 162 as illustrated in FIG. 5.

It is possible to efficiently release heat to the actuator 20 by increasing the area of the distal end of the metal member in the vicinity of the actuator 20 which is a cooling destination. Regarding the shape of the metal member 16, various shapes are possible within a scope of not departing from a gist thereof.

Third Embodiment

Figure 6:
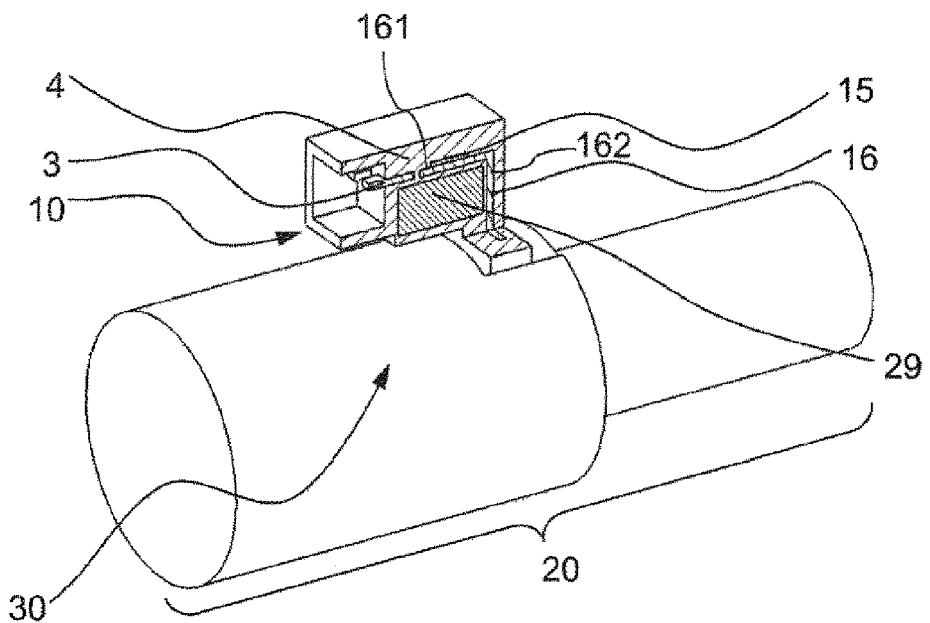
FIG. 6 is a cross-sectional view illustrating a heat dissipation structure of the electric actuator-integrated driver according to the third embodiment of the present invention.

FIG. 6 illustrates the third embodiment of the present invention. Specifically, FIG. 6 is a cross-sectional view illustrating a heat dissipation structure of the electric actuator-integrated driver of the third embodiment of the present invention.

In the present embodiment, a structure is provided in which a metal block 29 is mounted to the driver sealing portion between the metal member 16 mounting the electric actuator-integrated driver 15 and the internal heat generator 30, such as a motor and an electromagnetic coil, inside the electric actuator 20.

In other words, the electric actuator-integrated driver 15 further includes the metal block 29 adjacent to the part 161 and the part 162 of the metal member 16 (heat-conducting portion).

The actuator 20 includes the internal heat generator 30, such as the motor and the electromagnetic coil, therein and generates heat when energized. The metal block 29 is arranged to transfer heat generated from the internal heat generator 30 or the electric actuator-integrated driver 15 side and the driver sealing portion 4 in order to prevent the internal heat generator 30 from reaching higher temperature than the electric actuator-integrated driver 15 and transferring heat to the electric actuator-integrated driver 15 side and the driver sealing portion 4, or in order to transfer heat of the electric actuator-integrated driver 15 and the driver sealing portion 4, whereby it is possible to suppress a rise in temperature of the electric actuator-integrated driver 15.

Although the metal block is used as an example in this drawing, it is sufficient if the heat can be transferred, and various shapes are possible within a scope of not departing from a gist thereof.

Fourth Embodiment

Figure 7:
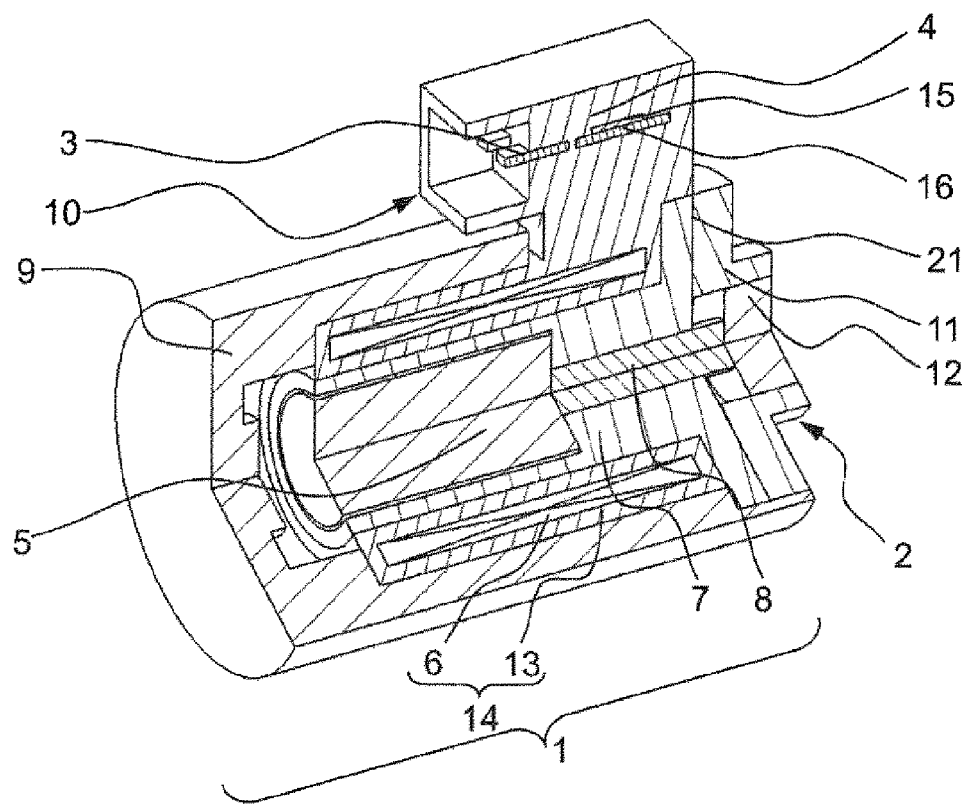
FIG. 7 is a cross-sectional view illustrating a heat dissipation structure of the electric actuator-integrated driver according to the fourth embodiment of the present invention.

FIG. 7 illustrates the fourth embodiment of the present invention. Specifically, FIG. 7 is a cross-sectional view illustrating a heat dissipation structure of the electric actuator-integrated driver of the fourth embodiment of the present invention.

In the present embodiment, a structure is provided in which heat generated from the electric actuator-integrated driver 15 is dissipated toward a fixed-core portion 7, a valve body 11, and a valve 12 constituting the actuator 20. Here, the fixed-core portion 7, the valve body 11, and the valve 12 are configured using a material that has lower temperature than the electric actuator-integrated driver 15 and has excellent thermal conductivity.

The actuator 20 is constituted by a solenoid portion 1 and a valve portion 2 a part of which is schematically illustrated (a part of which is not illustrated in FIG. 7). The solenoid portion 1 is constituted by a coil bobbin 14 formed of an electromagnetic coil 6 and a bobbin 13 molded using a synthetic resin material or the like, the fixed-core portion 7 made of a magnetic material, a column-shaped iron core 5 also made of a magnetic material, a column-shaped rod 8, and an actuator housing 9.

The fixed-core portion 7 held by the actuator housing 9 is arranged coaxially with the iron core 5, the rod 8, and the coil bobbin 14. The iron core 5 and the rod 8 are positioned inside the fixed-core portion 7, and the iron core 5 is magnetized when a current flows in the coil bobbin 14 and adheres to the fixed-core portion 7 made of the magnetic material. Along with this, the rod 8 is pushed by the iron core 5, and the valve 12 is pushed by the rod 8. When the current does not flow in the coil bobbin 14, the magnetization of the iron core 5 disappears, the iron core 5 separates from the fixed-core portion 7, and accordingly, the rod 8 and the valve 12 return to the original positions.

The valve portion 2 is constituted by the valve body 11 and the valve 12 coaxially arranged inside the valve body 11. The valve body 11 and the valve 12 are provided with a plurality of flow path openings through which a fluid flows in and out. In addition, the valve body 11 is in contact with the fixed-core portion 7 at a contact surface A (21), and is fixed by the actuator housing 9 in the same manner as the fixed-core portion 7.

The valve 12 performs linear motion so as to open and close the flow path opening. Here, the electric actuator-integrated driver 15 controls the linear motion.

The electric actuator-integrated driver 15 is mounted on the metal member 16 having favorable thermal conductivity and is integrally sealed by the driver sealing portion 4. As the bobbin 13 and the driver sealing portion 4 are made of the same resin material having favorable thermal conductivity, the heat generated from the electromagnetic coil 6 wound around the bobbin 13 and the electric actuator-integrated driver 15 is efficiently transferred to the bobbin 13 and the driver sealing portion 4 and is transferred to the valve body 11 and the valve 12 via the fixed-core portion 7 in contact with the bobbin 13 and the driver sealing portion 4. That is, it is possible to improve the thermal conductivity of a heat dissipation path from the electric actuator-integrated driver 15 to a heat dissipation destination, and further, to improve the heat dissipation performance of the electric actuator-integrated driver 15.

In this manner, the electric actuator 20 further includes the bobbin 13 which is inserted through the fixed-core portion 7 and around which the electromagnetic coil 6 is wound. The driver sealing portion 4 is integrally formed with the bobbin 13.

Although the metal member 16 is not extended to the electric actuator 20 side in FIG. 7, the heat conductivity between the electric actuator-integrated driver 15 and the electric actuator 20 as the heat dissipation destination may be increased by extending the metal member 16 to the actuator 20 side in order to further improve the heat dissipation performance.

Fifth Embodiment

Figure 8:
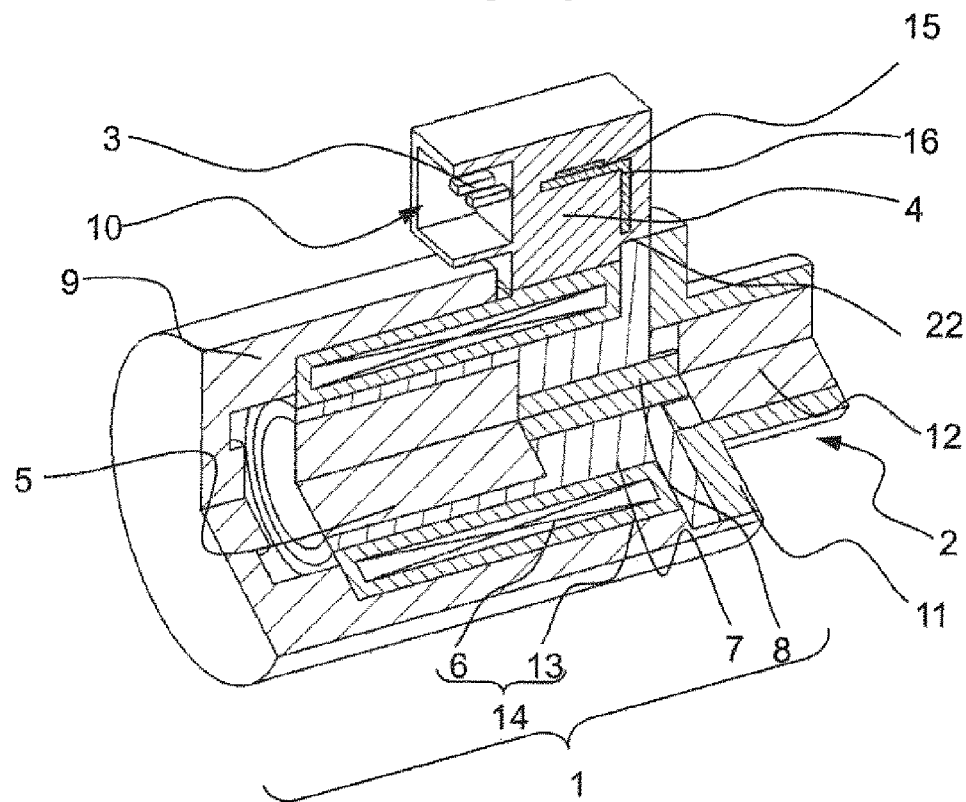
FIG. 8 is a cross-sectional view illustrating a heat dissipation structure of the electric actuator-integrated driver according to the fifth embodiment of the present invention.

FIG. 8 illustrates the fifth embodiment of the present invention. Specifically, FIG. 8 is a cross-sectional view illustrating a heat dissipation structure of the electric actuator-integrated driver according to the fifth embodiment of the present invention.

In the present embodiment, the driver sealing portion 4 has a structure which is characterized by being a dissimilar resin material higher than the thermal conductivity of the bobbin 13 around which the electromagnetic coil 6 is wound, for example, a resin material containing a heat-dissipating filler. A part of the heat generated from the electric actuator-integrated driver 15 is transferred to the driver sealing portion 4. As the driver sealing portion 4 is in contact with the fixed-core portion 7 at a contact surface B (22), it is possible to dissipate not only the heat of the metal member 16 but also the heat of the driver sealing portion 4.

Although the bobbin 13 and the driver sealing portion 4 may be made of the same resin material having favorable thermal conductivity, the cost increases. Thus, it is possible to form the heat dissipation structure at low cost by molding only the driver sealing portion 4 with the resin material having favorable thermal conductivity. The thermal conductivity of the resin material itself is low as well-known, and thus, the resin material may contain a metal filler subjected to insulating treatment in order to enhance the thermal conductivity of the resin material.

For example, an insulating metal filler such as alumina is conceivable as a material of the filler, and it is necessary to appropriately set a content, a particle diameter, a shape, and the like of the filler to be contained when considering connection reliability such as breakage of the wire bonding at the time of molding. A nonmetal filler, for example, silica, boron nitride or the like, other than the metal filler may be used to enhance the thermal conductivity of the driver sealing portion 4.

The driver sealing portion 4 may form the connector housing 10 that holds the terminal 3 to be connected to an external wiring and is fitted with an external connector. In the case of forming the connector housing 10, it is necessary to select a material having strength capable of withstanding fitting.

Here, the distal end of the metal member 16 (heat-conducting portion) extended to the electric actuator 20 is adjacent to a component of the electric actuator 20 to be cooled. Specifically, the electric actuator 20 controls a hydraulic oil to be used in an onboard device. The distal end of the metal member 16 (heat-conducting portion) extended to the electric actuator 20 is adjacent to the component of the electric actuator 20 to be cooled by the hydraulic oil.

In other words, the electric actuator 20 includes: the fixed-core portion 7 which is a magnetic body; the electromagnetic coil 6 wound around the fixed-core portion 7, the valve 12 driven depending on an electromagnetic force of the electromagnetic coil 6, and the valve body 11 which is in contact with the fixed-core portion 7 and slidably holds the valve 12. The distal end of the metal member 16 (heat-conducting portion) extended to the electric actuator 20 is adjacent to the fixed-core portion 7.

Here, the electric actuator 20 further includes the bobbin 13 which is inserted through the fixed-core portion 7 and around which the electromagnetic coil 6 is wound. The driver sealing portion 4 is in contact with the bobbin 13 and the fixed-core portion 7. The thermal conductivity of the driver sealing portion 4 is higher than the thermal conductivity of the bobbin 13.

Sixth Embodiment

Figure 9:
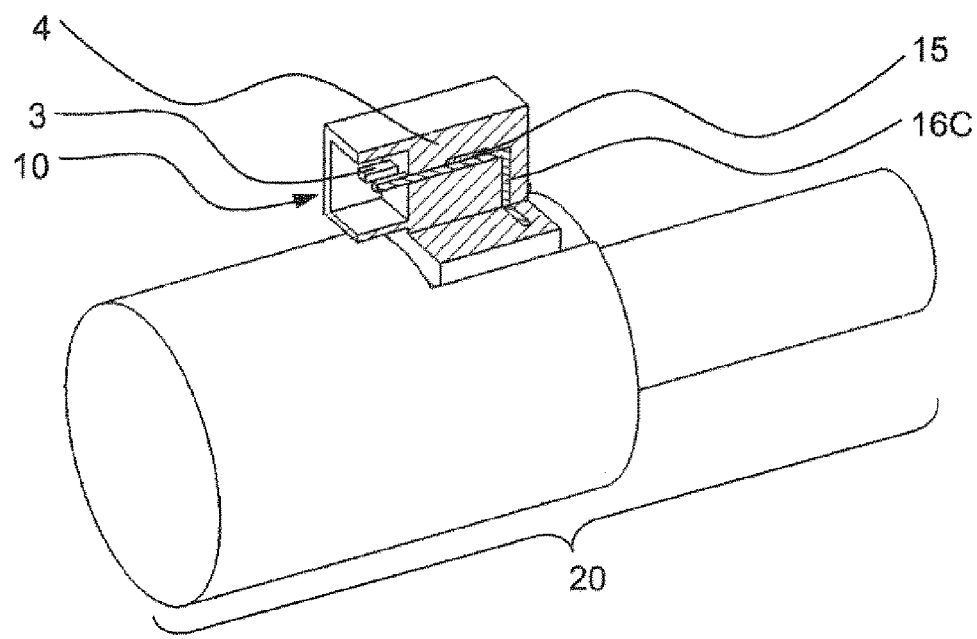
FIG. 9 is a cross-sectional view illustrating a heat dissipation structure of the electric actuator-integrated driver according to the sixth embodiment of the present invention.

FIG. 9 illustrates the sixth embodiment of the present invention. Specifically, FIG. 9 is a cross-sectional view illustrating a heat dissipation structure of the electric actuator-integrated driver of the sixth embodiment of the present invention.

In the present embodiment, a structure is formed in which the terminal 3 for connection with an external wiring and the metal member 16 mounting the electric actuator-integrated driver 15 have an integrated shape, thereby forming a terminal-integrated metal member 16C. It is possible to dissipate heat transferred to the terminal-integrated metal member 16C not only to the actuator 20 but also to an external harness, and it is possible to improve the heat dissipation performance of the electric actuator-integrated driver 15.

Although only one terminal 3 is illustrated on the drawing, a plurality of terminals and a metal member may be formed to have an integrated shape in order to enhance the heat dissipation performance to the external harness.

In other words, the electric actuator-integrated driver 15 further includes at least one external wiring terminal 3 to be connected to the external harness (external wiring) through which a control signal of a driver circuit propagates or at least one electromagnetic coil terminal to be connected to the electromagnetic coil 6. The metal member (heat-conducting portion) may be integrated with at least one of the external wiring terminal 3 or the electromagnetic coil terminal.

In addition, only the terminal integrated with the metal member may be set to be thicker than the other terminal in order to improve the heat dissipation performance to the external harness. Since the terminal-integrated metal member 16C also serves as a terminal function, it is necessary to perform plating or the like for fitting.

In other words, the external wiring terminal 3 or the electromagnetic coil terminal that is integrated with the metal member (heat-conducting portion) may be set to be thicker than the external wiring terminal 3 or an electromagnetic coil terminal that is not integrated with the metal member.

However, there is also a possibility that a maximum current value is lowered along with a temperature rise of the terminal 3 caused by the heat dissipation to the external harness, and thus, it is necessary to sufficiently study this heat dissipation structure beforehand.

Seventh Embodiment

Figure 10:
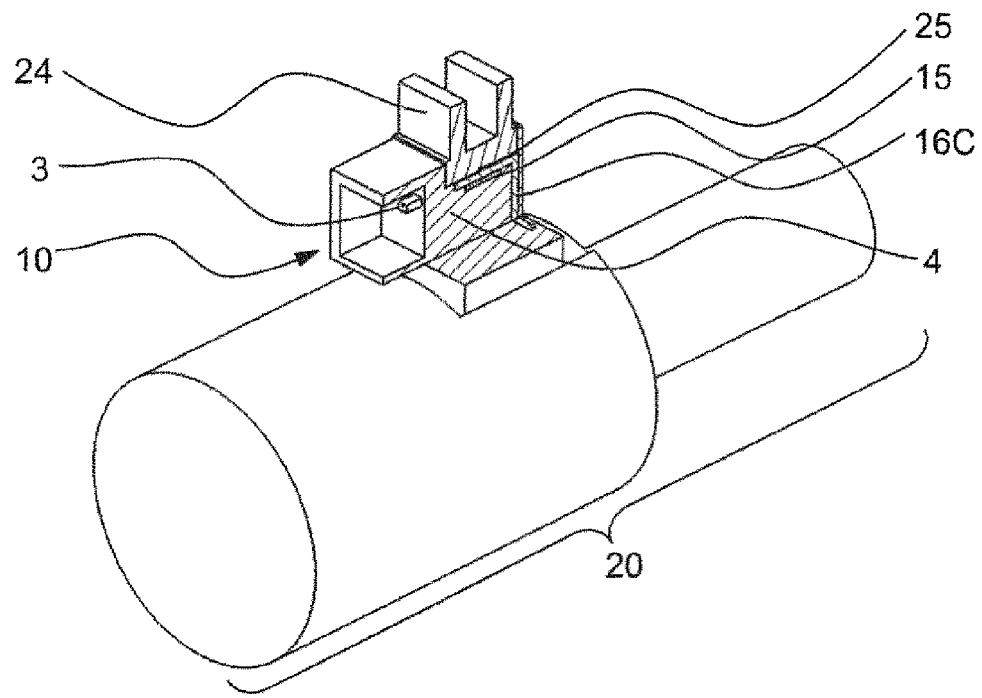
FIG. 10 is a cross-sectional view illustrating a heat dissipation structure of the electric actuator-integrated driver according to the seventh embodiment of the present invention.

FIG. 10 illustrates the seventh embodiment of the present invention. Specifically, FIG. 10 is a cross-sectional view illustrating a heat dissipation structure of the electric actuator-integrated driver of the seventh embodiment of the present invention.

In the present embodiment, a structure is formed in which a heat sink 24 is attached, by an insulating adhesive 25, to the metal member 16 on which the electric actuator-integrated driver 15 is mounted, and heat transferred from the electric actuator-integrated driver 15 to the metal member 16 is dissipated even to external environment via the heat sink 24. Although a shape of the heat sink 24 illustrated in FIG. 10 is merely an example, the heat sink 24 may have any shape as long as the shape has a heat dissipation effect, for example, a rod fin or the like. The insulating adhesive 25 has lower thermal conductivity than metal or the like, and thus, it is desirable that the metal member 16 and the heat sink 24 be bonded to be as thin as possible. For example, an adhesive tape and an adhesive sheet, which can secure the thickness, and a heat-dissipating adhesive having favorable thermal conductivity may be used.

Eighth Embodiment

Figure 11:
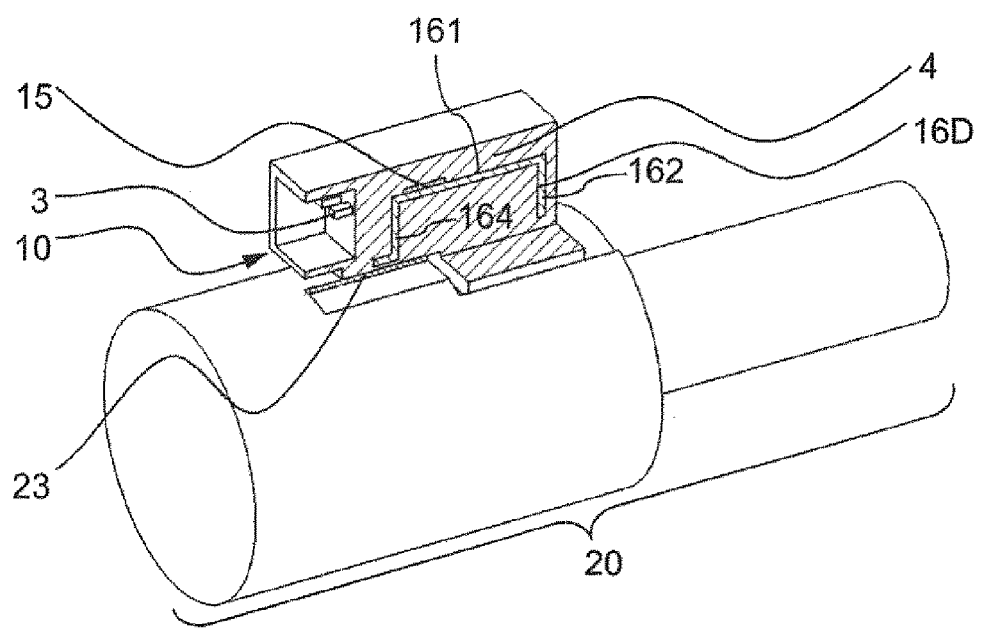
FIG. 11 is a cross-sectional view illustrating a heat dissipation structure of the electric actuator-integrated driver according to the eighth embodiment of the present invention.

FIG. 11 illustrates the eighth embodiment of the present invention. Specifically, FIG. 11 is a cross-sectional view illustrating a heat dissipation structure of the electric actuator-integrated driver according to the eighth embodiment of the present invention.

In the present embodiment, a structure is formed in which a long metal member 16D on which the electric actuator-integrated driver 15 is mounted is extended not only to the actuator 20 (the fixed-core portion 7) but also to a surface of an exterior portion of the actuator 20, and the driver sealing portion 4 is in contact with the surface of the exterior portion at a contact surface C (23).

In other words, the metal member (heat-conducting portion) further includes a part 164 that extends from the other end of the part 161 in a direction crossing an axis of the electric actuator 20 (specifically, in a vertical direction) and is adjacent to a housing of the electric actuator 20.

There is a case where heat generated from an internal heat generator, for example, a motor or an electromagnetic coil, provided in the actuator is transferred to the surface of the exterior portion. Incidentally, the temperature of the motor or the electromagnetic coil changes depending on a control state such as a value of a flowing current or the like and an internal shape of a solenoid.

When the temperature of the surface of the exterior portion is lower than the temperature of the long metal member 16D, the electric actuator housing 9 functions as a heat sink, it is possible to transfer heat generated from the electric actuator-integrated driver 15 via the long metal member 16D having favorable thermal conductivity, and it is possible to improve the heat dissipation performance of the electric actuator-integrated driver 15. Insulation coating treatment, for example, cation electrodeposition, to improve surface thermal emissivity may be performed in order to improve the heat dissipation performance from the surface of the exterior portion to the external environment.

Ninth Embodiment

Figure 12:
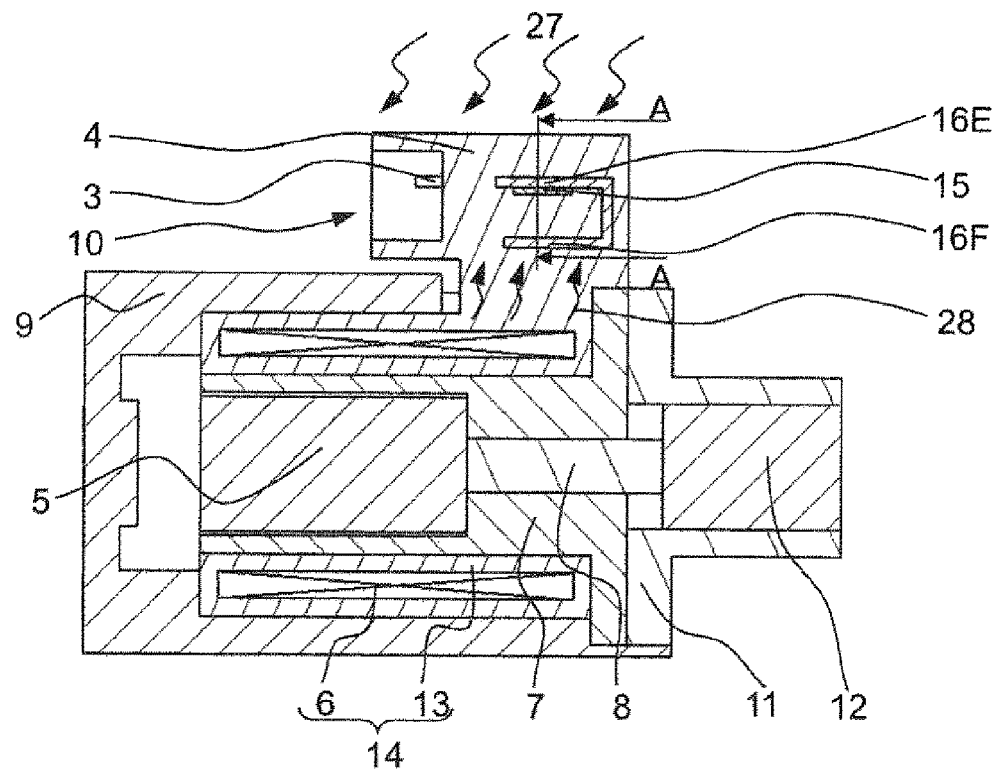
FIG. 12 is a cross-sectional view illustrating a heat dissipation structure of the electric actuator-integrated driver according to the ninth embodiment of the present invention.
Figure 13:
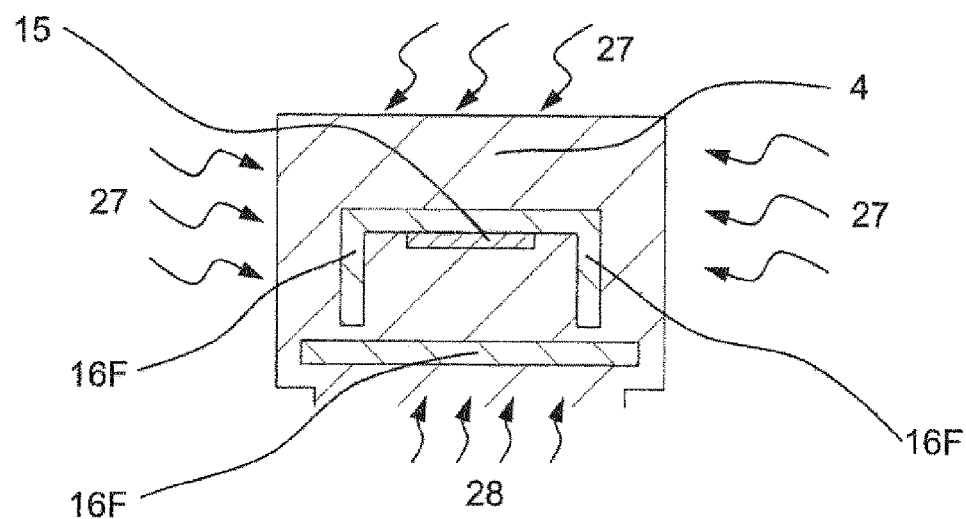
FIG. 13 is a cross-sectional view illustrating a heat dissipation structure of another part of the electric actuator-integrated driver according to the ninth embodiment of the present invention.

FIGS. 12 and 13 illustrate the ninth embodiment of the present invention. Specifically, FIG. 12 is a cross-sectional view illustrating a heat dissipation structure of the electric actuator-integrated driver of the ninth embodiment of the present invention. FIG. 13 is a cross-sectional view illustrating a heat dissipation structure of another part of the electric actuator-integrated driver according to the ninth embodiment of the present invention.

In the present embodiment, a structure is formed in which a shielding metal member 16E having a noise-shielding wall 16F protects the electric actuator-integrated driver 15 from external noise 27 coming from external environment and radiant noise 28 generated from the electromagnetic coil 6 inside the actuator 20. Since the driver sealing portion 4 is made of a resin material, substantially the entire external noise 27 passes through the inside of the driver sealing portion 4 without being reflected so that there is a possibility that the electric actuator-integrated driver 15 malfunctions.

Even if the external noise 27 passes through the inside of the driver sealing portion 4, the external noise 27 is reflected by the shielding metal member 16E having the noise-shielding wall 16F and flies to the outside as the shielding metal member 16E having the noise-shielding wall 16F is positioned before reaching the electric actuator-integrated driver 15. The external noise 27 does not reach the electric actuator-integrated driver 15, and it is possible to protect the electric actuator-integrated driver 15 from the noise. As well-known, the direction illustrated in the drawing is an example since the external noise 27 comes from all directions, and the positions of the electric actuator-integrated driver 15, the noise-shielding wall 16F, and the shielding metal member 16E are not limited to the above-described positions.

The radiant noise 28 is generated from a noise source such as the electromagnetic coil 6 inside the electric actuator 20. As the shielding metal member 16E having the noise-shielding wall 16F is installed between the noise source and the electric actuator-integrated driver 15, it is possible to reflect the radiant noise 28 and to protect the electric actuator-integrated driver 15. In addition, it is possible to improve the shielding performance at low cost since the metal member for heat dissipation also serves the noise-shielding function. It is necessary to form the shielding metal member 16 to have a larger shape than the electric actuator-integrated driver 15.

Although the shielding metal member 16E having the noise-shielding wall 16F that reflects the external noise 27 and the radiant noise 28 has the integrated shape in the present embodiment, a shielding structure may be formed using a plurality of metal members. For example, one of the metal members may be equipped with an electric actuator-integrated driver and extended to a cooling part of the electric actuator, and another metal member may be arranged as a metal member for noise shielding.

In this manner, the metal member (heat-conducting portion) includes the noise-shielding wall 16F that shields an electromagnetic wave from the outside or the electromagnetic coil 6.

Tenth Embodiment

Figure 14:
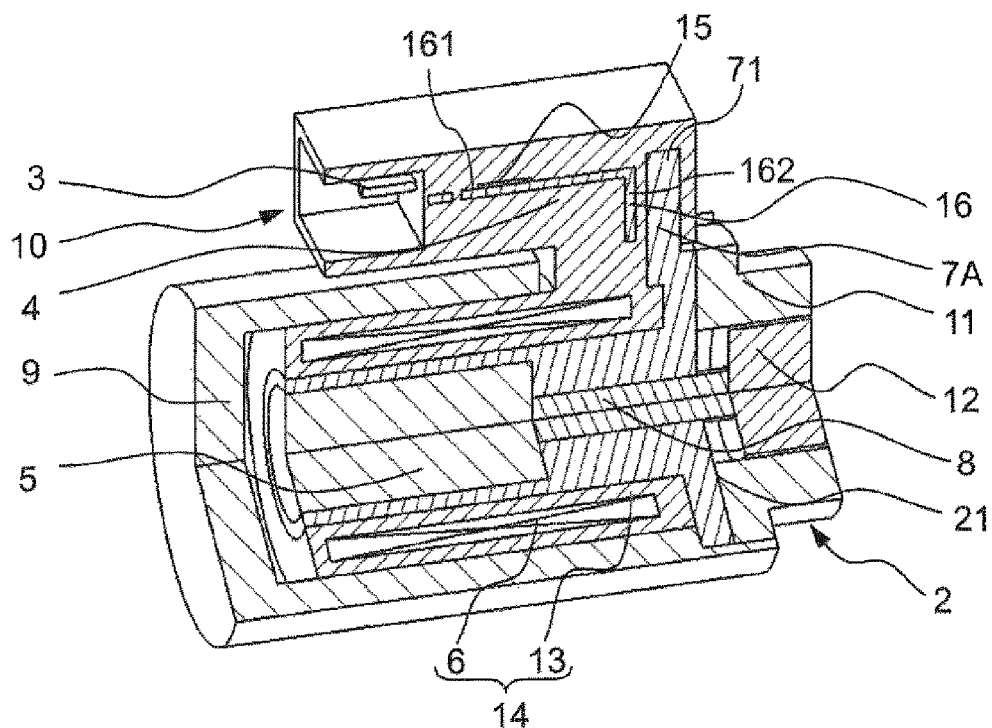
FIG. 14 is a cross-sectional view illustrating a heat dissipation structure of the electric actuator-integrated driver according to the tenth embodiment of the present invention.

FIG. 14 illustrates the tenth embodiment of the present invention. Specifically, FIG. 14 is a cross-sectional view illustrating a heat dissipation structure of the electric actuator-integrated driver of the tenth embodiment of the present invention.

In the present embodiment, a structure is formed in which a sealing-integrated fixed-core portion 7A extends so as to oppose the L-shaped metal member 16 with a constant clearance, and the extending part is sealed by the driver sealing portion 4 to have an integrated shape.

In other words, a fixed-core portion includes an opposing portion 71 that is adjacent to and oppose the part 162 of the metal member 16 as illustrated in FIG. 14.

The sealing-integrated fixed-core portion 7A, which is a magnetic material and has excellent thermal conductivity, extends to the vicinity of the metal member 16 and is integrally sealed with the driver sealing portion 4, and accordingly, heat transferred from the electric actuator-integrated driver 15 to the metal member 16 and the driver sealing portion 4 is efficiently transferred to the sealing-integrated fixed-core portion 7A and transferred to the valve body 11 and the external environment.

In addition, the electric actuator integrated with the electric actuator-integrated driver 15 may be, for example, a hydraulic electric actuator that controls hydraulic pressure of an onboard transmission. In the case of the hydraulic electric actuator, the valve portion 2 constituted by the valve body 11 and the valve 12 is provided with a flow path opening configured to allow oil to flow in and out, although schematically illustrated, so as to be exposed to the oil. The oil is cooled by an oil cooler, and the valve body 11 and the valve 12, which are components of the valve portion 2, are cooled by being exposed to the oil. In addition, the sealing-integrated fixed-core portion 7A in contact with the valve body 11 at the contact surface 21 is also cooled. That is, the heat can be efficiently released to the components of the electric actuator which is cooled by the oil in the present embodiment.

In addition, a structure in which the metal member 16 protrudes toward the electric actuator and is fitted in or sealed by a concave portion of the actuator may be adopted.

As for the heat dissipation path, the external harness via the terminal and the external environment using the heat sink have been described as described above, and the heat dissipation to the external harness has a problem of the maximum current value, and the heat dissipation using the heat sink has a problem that it is difficult to obtain sufficient heat dissipation performance when the external environment is high temperature and when there is no wind speed.

Thus, it is particularly desirable to form the heat dissipation structure with the most effective heat transfer to the actuator side that improves the thermal conductivity from the driver to the heat dissipation destination of the actuator, that is, the structure in which the largest amount of heat is released to the actuator.

Hereinafter, electric actuator-integrated drivers according to eleventh to sixteenth embodiments of the present invention will be described in detail with reference to the drawings. Incidentally, the same reference numerals indicate the same parts in each drawing.

Figure 15:
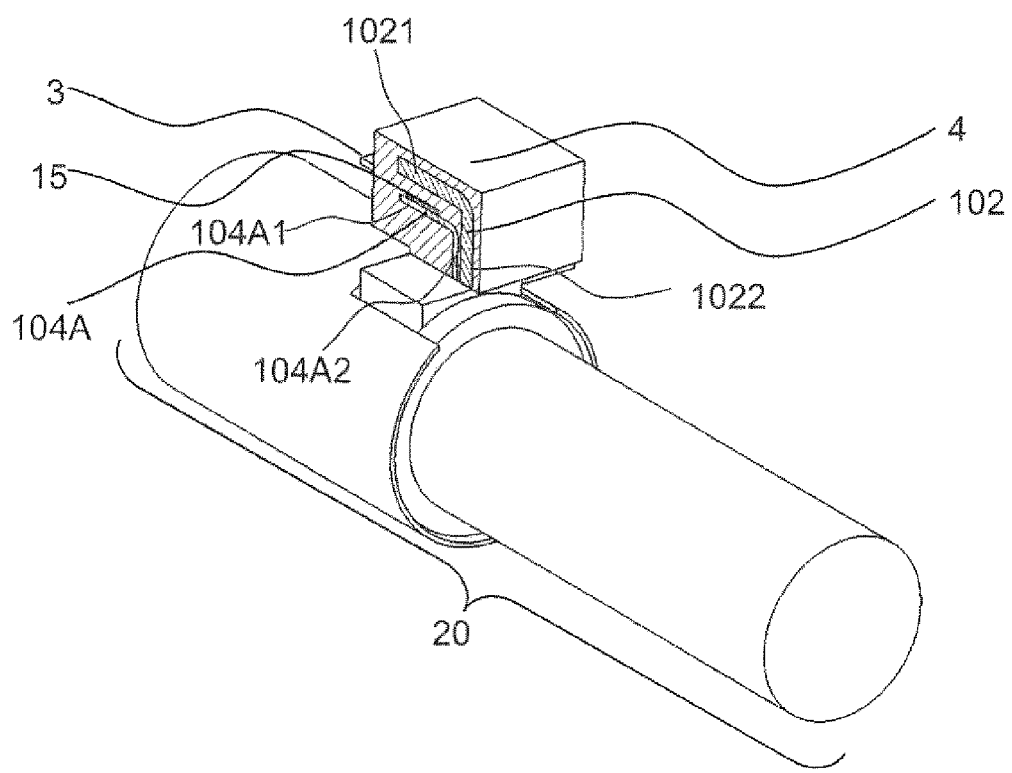
FIG. 15 is a cross-sectional view illustrating an example of a basic configuration of electric actuator-integrated drivers according to eleventh to sixteenth embodiments of the present invention.

FIG. 15 is a cross-sectional view illustrating an example of a basic configuration of the electric actuator-integrated drivers according to the eleventh to sixteenth embodiments of the present invention. A configuration and an operation of the electric actuator 20 illustrated in FIG. 15 are the same as those of the electric actuator 20 illustrated in FIG. 1.

The driver sealing portion 4 integrally seals the electric actuator-integrated driver 15, a base 104A mounting the electric actuator-integrated driver 15, the terminal 3, the wire bonding, and a metal member 102 to be described below, and is integrated with the electric actuator 20.

In other words, the driver sealing portion 4 is fixed to the electric actuator 20 and stores the electric actuator-integrated driver 15 therein. As a material of the driver sealing portion 4, the driver sealing portion 4 is formed using, for example, epoxy resin, unsaturated polyester, or the like having excellent heat resistance. In addition, the material may contain a heat-dissipating filler in order to enhance thermal conductivity of the driver sealing portion 4. As a material of the base 104A, the base 104A is formed using, for example, a metal material having favorable thermal conductivity.

The metal member 102 (heat-conducting portion) is arranged so as to be in contact with the electric actuator 20, and extends (stretches) to the electric actuator-integrated driver 15 and the driver sealing portion 4. In other words, the metal member 102 is in contact with the driver sealing portion 4 that seals the electric actuator-integrated driver 15 and the electric actuator 20, and conducts heat.

Specifically, the metal member 102 (heat-conducting portion) has a part 1021 along the axial direction of the electric actuator 20 and a part 1022 extending from one end of the part 1021 along a direction crossing the axis of the electric actuator 20. The part 1022 is in contact with the electric actuator 20.

Regarding a shape of the metal member 102, various shapes are conceivable within a scope of not departing from a gist thereof. In addition, a surface of the metal member 102 may be subjected to, for example, insulation treatment such as alumite and electrodeposition coating, roughening treatment, or the like. When the metal member 102 is subjected to surface treatment, the adhesion with the driver sealing portion 4 is improved, and it is possible to improve the thermal conductivity from the electric actuator-integrated driver 15 to the heat dissipation destination, and further, to improve the heat dissipation performance of the electric actuator-integrated driver 15.

The heat generated from the electric actuator-integrated driver 15 is dissipated to the electric actuator 20 via the driver sealing portion 4, the base 104A, and the metal member 102. The electric actuator 20 is cooled by a metal housing, for example, by being attached to the metal housing and is cooled as a fluid to be controlled by the electric actuator 20 passes through the electric actuator, and thus, is excellent as the heat dissipation destination.

Incidentally, the base 104A on which the electric actuator-integrated driver 15 (driver circuit) is mounted includes a part 104A1 along the axial direction of the electric actuator 20 and a part 104A2 extending from one end of the part 104A1 along a direction crossing the axis of the electric actuator 20 in the present embodiment, as illustrated in FIG. 15. The part 104A2 is in contact with the electric actuator 20. Accordingly, the heat generated from the electric actuator-integrated driver 15 is dissipated to the electric actuator 20 via the base 104A. That is, the base 104A functions as a heat-conducting portion that conducts the heat generated by the electric actuator-integrated driver 15 to the electric actuator 20.

Eleventh Embodiment

Figure 16:
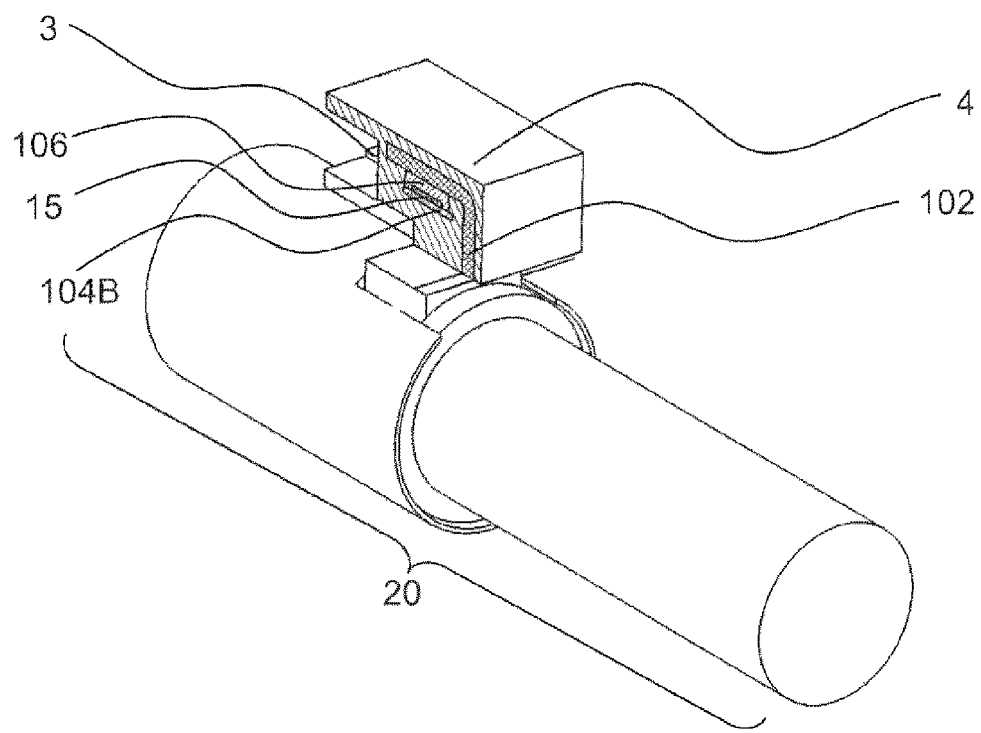
FIG. 16 is a cross-sectional view illustrating a heat dissipation structure of the electric actuator-integrated driver according to the eleventh embodiment of the present invention.

FIG. 16 illustrates the eleventh embodiment of the present invention. Specifically, FIG. 16 is a cross-sectional view illustrating a heat dissipation structure of the electric actuator-integrated driver of the eleventh embodiment of the present invention.

In the present embodiment, the electric actuator-integrated driver 15 is in contact with the metal member 102 via a heat-dissipating member 106. The metal member 102 is arranged so as to be in contact with the electric actuator 20, and heat generated from the electric actuator-integrated driver 15 is dissipated to the electric actuator 20 side via the heat-dissipating member 106 and the metal member 102. For example, a sheet having favorable thermal conductivity, grease, an adhesive, and the like that have excellent heat resistance are conceivable as the heat-dissipating member 106. In other words, the heat-dissipating member 106 is a member (dissimilar member) that is arranged between the metal member 102 (heat-conducting portion) and the electric actuator-integrated driver 15 (driver circuit), and is made of a different material from the driver sealing portion 4 (sealing portion) as illustrated in FIG. 16.

In addition, there is a case where the electric actuator-integrated driver 15 includes wire bonding to electrically connect the driver circuit. Since the wire bonding has a small diameter, there is a possibility of breakage at the time of forming the driver sealing portion 4. As the heat-dissipating member 106 is arranged such that the wire bonding is buried, it is possible to protect the wire bonding (wire bonding material) at the time of forming the driver sealing portion 4. In other words, a bonding wire is buried by the heat-dissipating member 106 (dissimilar member) and is electrically connected to the electric actuator-integrated driver 15 (driver circuit).

Incidentally, a material to bury the wire bonding is not limited to the heat-dissipating member, in other words, is not necessarily a material having excellent thermal conductivity. That is, for example, a silicon material, an epoxy material, an acrylic material, or the like that does not contain a heat-dissipating filler or the like may be used instead of the heat-dissipating member 106.

Twelfth Embodiment

Figure 17:
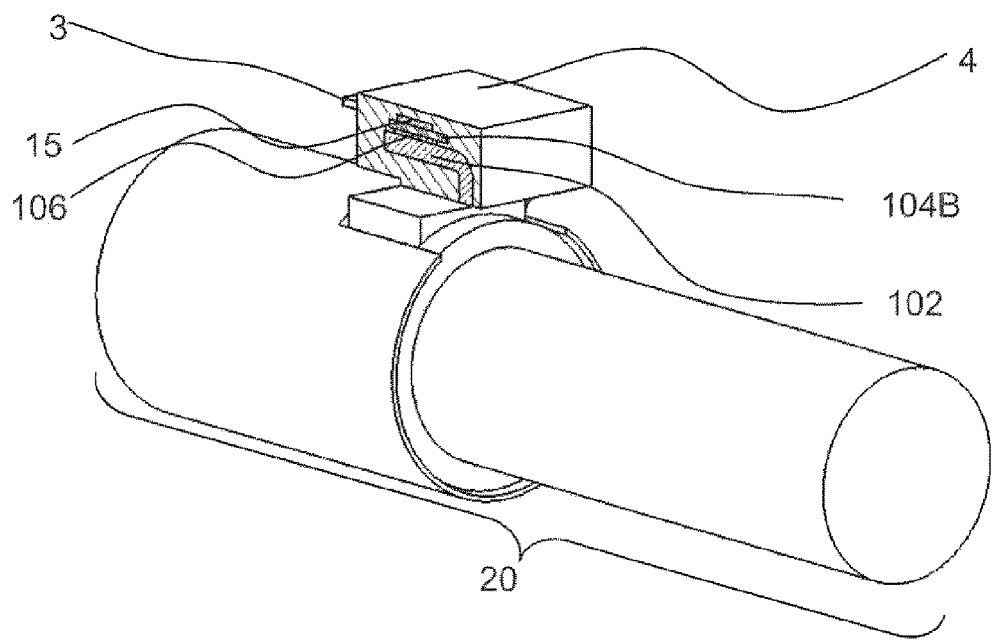
FIG. 17 is a cross-sectional view illustrating a heat dissipation structure of the electric actuator-integrated driver according to the twelfth embodiment of the present invention.

FIG. 17 illustrates a twelfth embodiment of the present invention. Specifically, FIG. 17 is a cross-sectional view illustrating a heat dissipation structure of an electric actuator-integrated driver of the twelfth embodiment of the present invention.

In the present embodiment, the structure is formed in which a base 104B mounting the electric actuator-integrated driver 15 is in contact with the metal member 102, which is in contact with the electric actuator 20, via the heat-dissipating member 106. The base 104B conducts heat generated from the electric actuator-integrated driver 15. In particular, when a material of the base 104B is metal, the heat generated from the electric actuator-integrated driver 15 is efficiently conducted to the base 104B. The heat transferred to the base 104B is dissipated to the electric actuator 20 via the heat-dissipating member 106 and the metal member 102. In other words, the heat-dissipating member 106 is a member (dissimilar member) that is arranged between the base 104B on which the electric actuator-integrated driver 15 (driver circuit) is mounted and the metal member 102 (heat-conducting portion), and is made of a different material from the driver sealing portion (sealing portion) as illustrated in FIG. 17.

Thirteenth Embodiment

Figure 18:
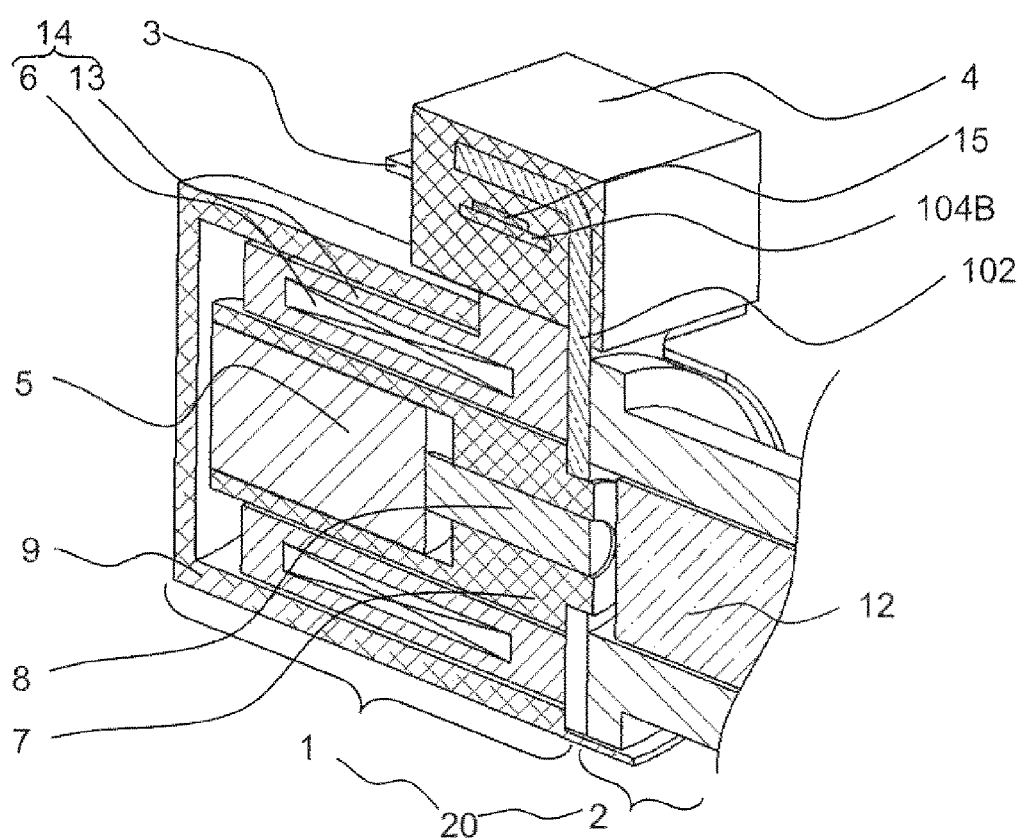
FIG. 18 is a cross-sectional view illustrating a heat dissipation structure of the electric actuator-integrated driver according to the thirteenth embodiment of the present invention.

FIG. 18 illustrates a thirteenth embodiment of the present invention. Specifically, FIG. 18 is a cross-sectional view illustrating a heat dissipation structure of an electric actuator-integrated driver of the thirteenth embodiment of the present invention.

Although specific configuration and operation of the electric actuator 20 are similar to those of the fourth embodiment of FIG. 7, the driver sealing portion 4 and the bobbin 13 are made of different materials in FIG. 18. However, the same material may be used, and the driver sealing portion 4 and the bobbin 13 may be integrally molded.

Heat generated when the electromagnetic coil 6 is energized is transferred to the electric actuator-integrated driver 15 via the bobbin 13 and the driver sealing portion 4 so that the electric actuator-integrated driver 15 is exposed to high temperature. Heat generated from the electric actuator 20 is dissipated via the driver sealing portion 4, the base 104B, and the metal member 102.

The metal member 102 is in contact with the valve portion 2. Although schematically illustrated, the valve portion 2 has a valve therein and is provided with a plurality of flow path openings through which a fluid flows in and out. The fluid constantly flows in and out through the flow path opening in the valve portion 2, and the valve portion 2 is cooled by being exposed to the fluid. The metal member 102 (heat-conducting portion) is cooled by being in contact with the cooled valve portion 2. That is, the heat generated from the electric actuator-integrated driver 15 can be efficiently released to the electric actuator 20 via the metal member 102.

Incidentally, the electric actuator 20 includes the coil bobbin 14 constituted by the electromagnetic coil 6 and the bobbin 13 around which the electromagnetic coil 6 is wound, the fixed-core portion 7 that holds the coil bobbin 14, the valve driven depending on an electromagnetic force of the electromagnetic coil 6, the valve portion 2 that holds the valve 12, and the electric actuator housing 9 as illustrated in FIG. 18. The electric actuator housing 9 holds the coil bobbin 14, the fixed-core portion 7, the valve 12, and the valve portion 2.

Although being in contact with the metal member 102 via the driver sealing portion 4 in FIG. 18, the electric actuator-integrated driver 15 may be in contact with the metal member 102, for example, via a heat-dissipating member having excellent thermal conductivity in order to further improve the heat dissipation performance.

Fourteenth Embodiment

Figure 19:
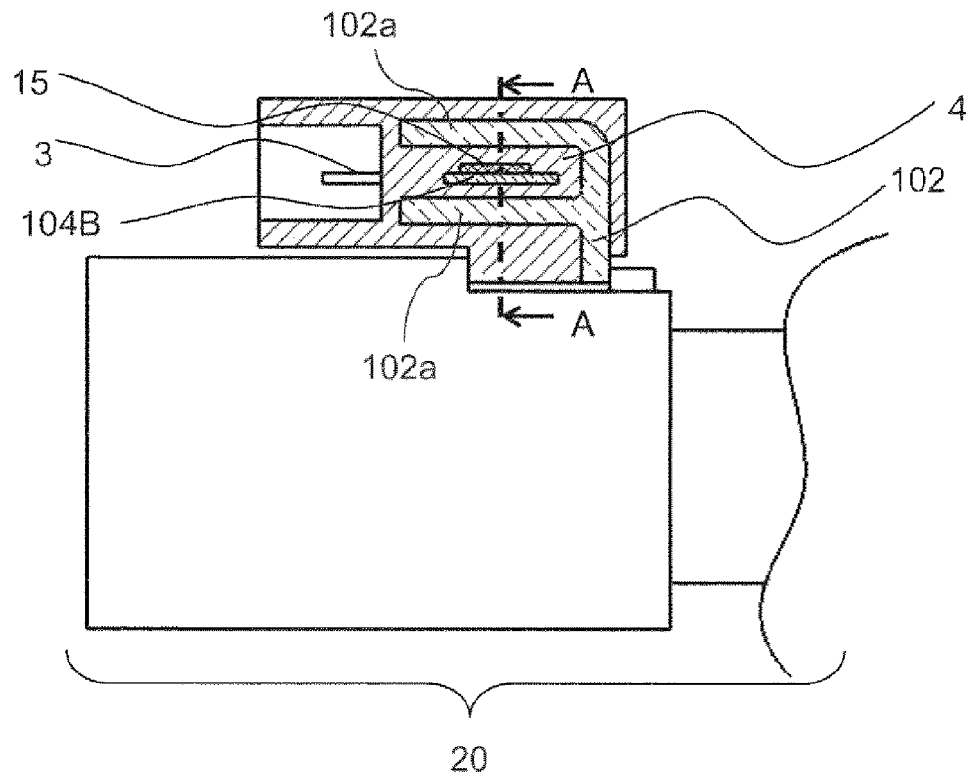
FIG. 19 is a cross-sectional view illustrating a heat dissipation structure of the electric actuator-integrated driver according to the fourteenth embodiment of the present invention.
Figure 20:
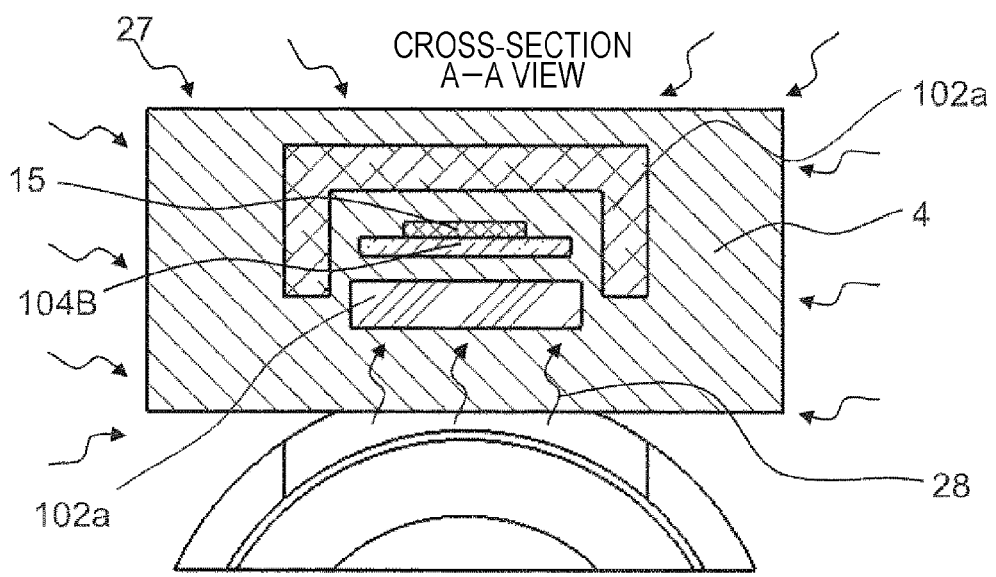
FIG. 20 is a cross-sectional view illustrating a heat dissipation structure of another part of the electric actuator-integrated driver according to the fourteenth embodiment of the present invention.

FIGS. 19 and 20 illustrate a fourteenth embodiment of the present invention. Specifically, FIG. 19 is a cross-sectional view illustrating a heat dissipation structure of an electric actuator-integrated driver according to the fourteenth embodiment of the present invention, and FIG. 20 is a cross-sectional view illustrating a heat dissipation structure of another part of the electric actuator-integrated driver of the fourteenth embodiment of the present invention.

In the present embodiment, the metal member 102 having a metal shielding wall 102a is in contact with the electric actuator 20 and is arranged so as to cover the electric actuator-integrated driver 15, the driver sealing portion 4, and the base 104B with a constant clearance. As the metal shielding wall 102a covers the electric actuator-integrated driver 15 and is arranged between the external noise 27 (external radiation noise) and the radiant noise 28 (actuator radiation noise), and the electric actuator-integrated driver 15, it is possible to shield the noise generated from external environment and the inside of the actuator, and it is possible to protect the electric actuator-integrated driver 15 from the radiation noise.

Incidentally, although the electric actuator-integrated driver 15 is in contact with the metal shielding wall 102a via the driver sealing portion 4 in FIG. 19, the electric actuator-integrated driver 15 may be in contact with the metal shielding wall 102a via, for example, a heat-dissipating member having excellent thermal conductivity in order to further improve the heat dissipation performance. Furthermore, it is possible to improve the heat dissipation performance by bringing the heat generated from the electric actuator-integrated driver 15 into contact with the metal shielding wall 102a via the base 104B and the heat-dissipating member.

Fifteenth Embodiment

Figure 21:
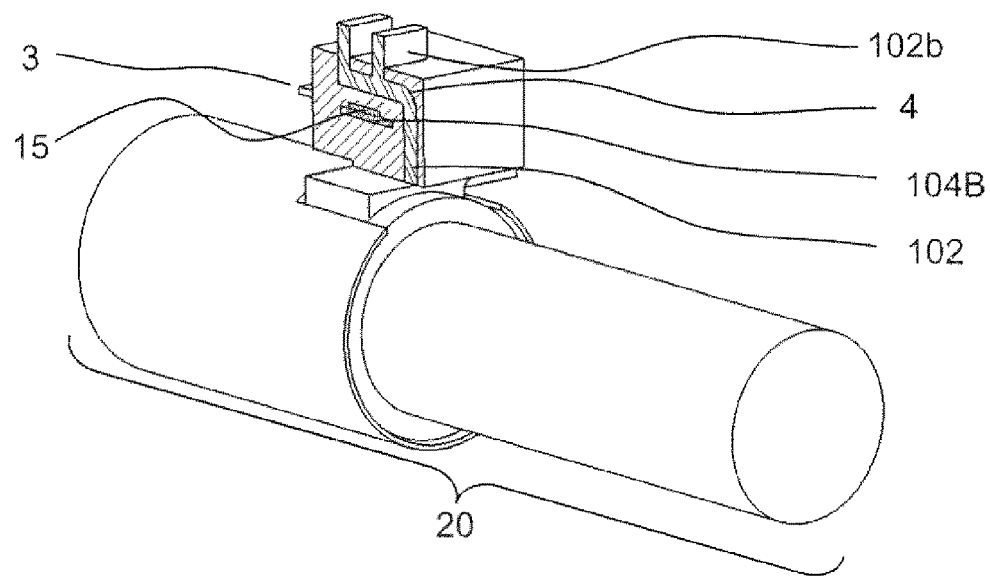
FIG. 21 is a cross-sectional view illustrating a heat dissipation structure of another part of the electric actuator-integrated driver according to the fifteenth embodiment of the present invention.

FIG. 21 illustrates a fifteenth embodiment of the present invention. Specifically, FIG. 21 is a cross-sectional view illustrating a heat dissipation structure of an electric actuator-integrated driver of the fifteenth embodiment of the present invention.

In the present embodiment, a heat-dissipating fin-equipped metal member 102 in contact with the electric actuator 20 includes a heat-dissipating fin 102b (externally-exposed portion). The heat-dissipating fin 102b is exposed to external environment, and the heat-dissipating fin-equipped metal member 102 is in contact with the electric actuator-integrated driver 15 via the driver sealing portion 4. Heat transferred from the electric actuator 20 to the heat-dissipating fin-equipped metal member 102 via the driver sealing portion 4 can be dissipated not only to the electric actuator 20 side but also to the external environment via the heat-dissipating fin 102b. The heat-dissipating fin-equipped metal member 102 may be subjected to insulation coating treatment, for example, cation electrodeposition, to improve surface thermal emissivity in order to further improve the heat dissipation performance to the external environment.

A shape of the heat-dissipating fin 102b illustrated in FIG. 21 is merely an example, and may be any shape as long as the shape has the heat dissipation effect, for example, a rod fin or the like. In addition, although being in contact with the electric actuator-integrated driver 15 via the driver sealing portion 4 in FIG. 21, the heat-dissipating fin-equipped metal member 102 may be in contact with the electric actuator-integrated driver 15, for example, via a heat-dissipating member having excellent thermal conductivity in order to further improve the heat dissipation performance.

Sixteenth Embodiment

Figure 22:
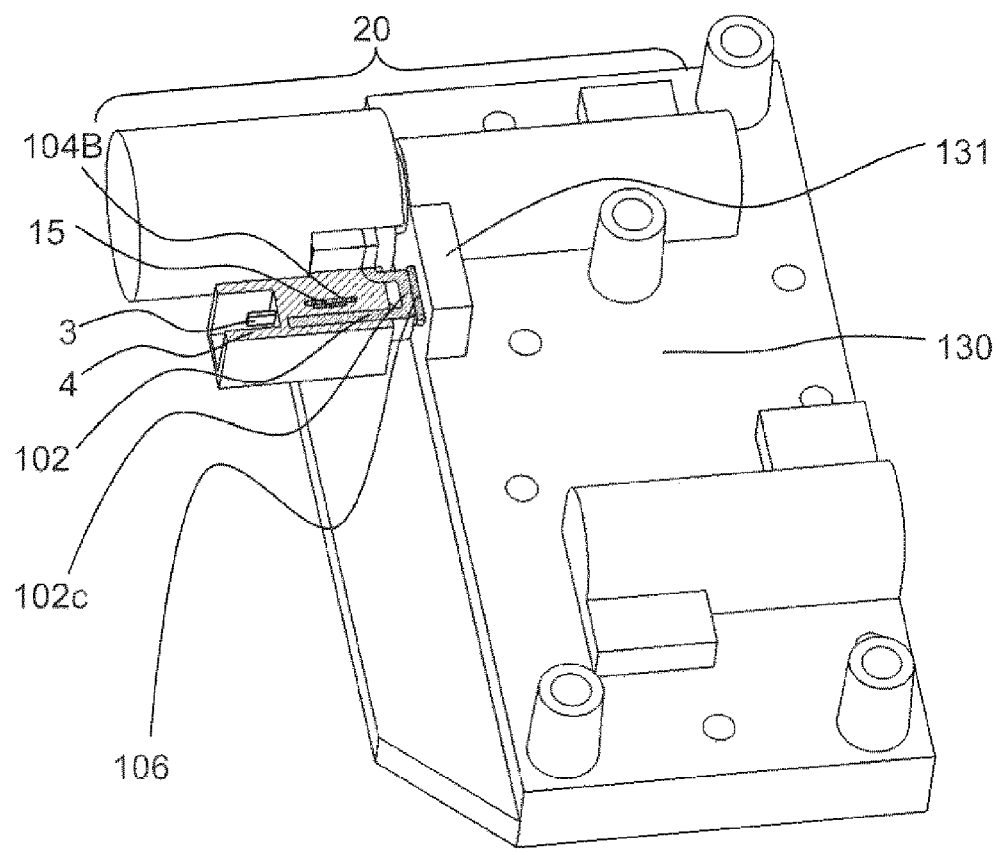
FIG. 22 is a cross-sectional view illustrating a heat dissipation structure of the electric actuator-integrated driver according to the sixteenth embodiment of the present invention.

FIG. 22 illustrates a sixteenth embodiment of the present invention. Specifically, FIG. 22 is a cross-sectional view illustrating a heat dissipation structure of an electric actuator-integrated driver of the sixteenth embodiment of the present invention. The electric actuator 20 is attached to a metal housing 130 having a heat-dissipating base 131. The metal member 102 (heat-conducting portion) in contact with the electric actuator 20 includes a heat-dissipating surface 102c (externally-exposed portion). The heat-dissipating surface 102c is exposed to the outside and is opposed to the heat-dissipating base 131 with a constant clearance, and the clearance is filled with a heat-dissipating member 106. Heat generated from the electric actuator-integrated driver 15 is dissipated to the metal housing 130 via the driver sealing portion 4, the metal member 102, and the heat-dissipating member 106. The metal housing 130 is cooled as a circulating fluid constantly flows in and out, and thus, is preferable as a heat dissipation destination.

In other words, the electric actuator 20 controls the fluid passing through a flow path provided in the metal housing 130. As illustrated in FIG. 22, the heat-dissipating surface 102c (externally-exposed portion) is connected to the metal housing 130 via the heat-dissipating member 106. In other words, the metal member 102 (heat-conducting portion) has a U-shaped portion (including the heat-dissipating surface 102c) exposed from the driver sealing portion 4, and the U-shaped portion is connected to the metal housing 130 via the heat-dissipating member 106.

Examples of a material of the metal housing 130 includes an aluminum die cast and the like. In addition, a surface of the metal housing 130 may be subjected to insulation treatment such as alumite and electrodeposition coating. The heat generated from the electric actuator-integrated driver 15 is efficiently dissipated to the external environment by the heat-radiation from the surface subjected to the insulation treatment.

Regarding a shape of the metal housing 130, various shapes are conceivable within a scope of not departing from a gist thereof, and for example, the metal housing 130 may be a part of components of a transmission.

Incidentally, the present invention is not limited to the above-described embodiments, and includes various modification examples. For example, the above-described embodiments have been described in detail in order to describe the present invention in an easily understandable manner, and are not necessarily limited to one including the entire configuration that has been described above. In addition, some configurations of a certain embodiment can be substituted by configurations of another embodiment, and further, a configuration of another embodiment can be added to a configuration of a certain embodiment. In addition, addition, deletion or substitution of other configurations can be made with respect to some configurations of each embodiment.

For example, an inner shape of the electric actuator can adopt various shapes.

The electric actuator-integrated driver 15 is illustrated as one in the above-described embodiments, but may be a plurality of elements. In addition, the bases 104A and 104B may be a resin material made of, for example, glass epoxy instead of being the metal material.

Although the driver sealing portion 4 is used as the sealing portion (storage portion) in the above-described embodiments, but a case (housing) may be used.

Embodiments of the present invention may be provided as the following aspects.

(1) A driver that is mounted on an actuator and drives the actuator, the driver including: a driver circuit that energizes the actuator with a drive current; and a heat dissipation path configured to conduct heat generated from the driver circuit to the actuator side.

(2) The driver described in (1), the driver including a metal member that mounts the driver circuit, in which the heat dissipation path has a structure in which the metal member extends to the actuator side.

(3) The driver described in any one of (1) and (2) in which the actuator includes: an electromagnetic coil; a fixed core that is a magnetic body; a valve that is driven by an electromagnetic force of the electromagnetic coil; and a body portion that movably holds the valve, and the heat dissipation path is a path to dissipate heat from the driver circuit to the fixed core, the body portion, or the valve side.

(4) The driver described in (3), the driver including a sealing resin that seals the driver circuit, in which the actuator includes a bobbin portion that stores the electromagnetic coil, the sealing resin is closer to the bobbin portion and the fixed core than other members of the actuator, and the heat dissipation path is formed such that thermal conductivity of the sealing resin is higher than thermal conductivity of the bobbin portion.

(5) The driver described in (4) in which the sealing resin is a resin containing a filler.

(6) The driver described in (2) in which the metal member is integrated with at least one of a terminal for electrical connection with an external wiring that allows the driver circuit to receive a control signal from the outside, and a terminal for electrical connection with the electromagnetic coil.

(7) The driver described in (6) in which, among the plurality of terminals to which the driver circuit is connected, a terminal integrated with the metal member is thicker than the other terminals among the plurality of terminals.

(8) The driver described in any one of (2), (6) and (7) in which the metal member is arranged between an external electromagnetic noise source or the electromagnetic solenoid and the driver circuit.

(9) The driver described in any one of (3) to (8), the driver including a sealing resin that seals the driver circuit, in which apart of the fixed core is sealed by the sealing resin.

(10) The driver described in any one of (3) to (9) in which the actuator is a hydraulic actuator configured to operate an onboard device, and at least a part of the body portion, the valve, and the fixed core is cooled with oil for driving the hydraulic actuator.

(11) The driver described in any one of (1) to (10) in which the heat dissipation path increases the amount of heat conducted from the driver circuit to the actuator side as compared with a case where the heat dissipation path is not provided.

(12) The driver described in any one of (1) to (11) in which the heat dissipation path dissipates more heat to the actuator side than to a side of an external space side or an external wiring that allows the driver circuit to receive a control signal from the outside.

(13) The driver described in any one of (2) or (6) to (8) in which the metal member is formed such that a tip extending to the actuator side has a shape to increase a contact area with the fixed core.

(14) The driver described in any one of (2), (6) to (8) or (13) in which the metal member protrudes to the actuator so as to be fitted in or sealed by the actuator.

(15) An actuator that includes: an actuator main body; and a driver that is mounted on the actuator main body and drives the actuator main body, the driver including a driver circuit that energizes the actuator main body with a drive current and a heat dissipation path configured to conduct heat generated from the driver circuit to the actuator main body side.

(16) A driver that is mounted on an actuator and drives the actuator, the driver including: a driver circuit that energizes the actuator with a drive current; and a metal member that mounts the driver circuit, in which the metal member extends to the actuator side.

(17) A driver that is mounted on an actuator and drives the actuator, the driver including: a driver circuit that energizes the actuator with a drive current; and a sealing resin that seals the driver circuit, in which the actuator includes an electromagnetic coil, a bobbin portion that stores the electromagnetic coil, and a fixed core that is a magnetic body, the sealing resin is closer to the bobbin portion and the fixed core than other members of the actuator, and thermal conductivity of the sealing resin is higher than thermal conductivity of the bobbin portion.

(51) An electric actuator-integrated driver that is integrally mounted on an electric actuator and drives the electric actuator based on a signal from the outside, the electric actuator-integrated driver including: a driver circuit that energizes the electric actuator with a drive current based on the signal; a metal member that conducts heat generated from the driver circuit to the electric actuator side; and a sealing portion that seals the driver circuit and the metal member, in which the metal member is in contact with the electric actuator.

(52) The electric actuator-integrated driver of (51) in which the driver circuit is in contact with the metal member via a dissimilar material different from a material constituting the sealing portion.

(53) The electric actuator-integrated driver of (52), the electric actuator-integrated driver including wire bonding for electrical connection with the driver circuit, in which the wire bonding is buried in the dissimilar material.

(54) The electric actuator-integrated driver described in (51) in which a base on which the driver circuit is mounted is in contact with the metal member via a dissimilar material different from a material constituting the sealing portion.

(55) The electric actuator-integrated driver described in (51) in which the electric actuator includes: a coil bobbin that is constituted by an electromagnetic coil and a bobbin around which the electromagnetic coil is wound; a fixed-core portion that holds the coil bobbin; a valve driven by an electromagnetic force of the electromagnetic coil; a valve portion that holds the valve; and an electric actuator housing that holds the coil bobbin, the fixed-core portion, the valve, and the valve portion, and the metal member is in contact with the valve portion.

(56) The electric actuator-integrated driver of (51) in which the metal member is surface-treated.

(57) The electric actuator-integrated driver of (51) in which the metal member includes a metal shielding wall that covers the driver circuit.

(58) The electric actuator-integrated driver of (51) in which apart of the metal member includes an externally-exposed portion.

(59) The electric actuator-integrated driver of (58) in which the externally-exposed portion is in contact, via a heat-dissipating member, with a metal housing having a flow path through which a fluid to be controlled by the electric actuator passes.

REFERENCE SIGNS LIST

1 . . . solenoid portion
2 . . . valve portion
3 . . . terminal
4 . . . driver sealing portion
5 . . . iron core
6 . . . electromagnetic coil
7 . . . fixed-core portion
7A . . . sealing-integrated fixed-core portion
8 . . . rod
9 . . . electric actuator housing
10 . . . connector housing
11 . . . valve body
12 . . . valve
13 . . . bobbin
14 . . . coil bobbin
15 . . . electric actuator-integrated driver
16 . . . metal member
16A . . . rectangle-shaped metal member
16B . . . thick metal member
16C . . . terminal-integrated metal member
16D . . . long metal member
16E . . . shielding metal member
16F . . . noise-shielding wall
16G . . . distal end-extended metal member
20 . . . electric actuator
21 . . . contact face A
22 . . . contact face B
23 . . . contact face C
24 . . . heat sink
25 . . . insulating adhesive
27 . . . external noise
28 . . . radiant noise
29 . . . metal block
30 . . . internal heat generator
102 . . . metal member
104A, 104B . . . base
106 . . . heat-dissipating member
102a . . . metal shielding wall
102b . . . heat-dissipating fin
102c . . . heat-dissipating surface
130 . . . metal housing
131 . . . heat-dissipating base

The invention claimed is:

1. A driver comprising:
a driver circuit that controls a current to be supplied to an electric actuator;
a heat-conducting portion that conducts heat generated in the driver circuit; and
a sealing portion that is fixed to the electric actuator and seals the driver circuit and the heat-conducting portion,
wherein the heat-conducting portion is extended to the electric actuator,
wherein the heat-conducting portion mounts the driver circuit,
wherein the electric actuator comprises:
a fixed core that is a magnetic body;
an electromagnetic coil that is wound around the fixed core;
a valve that is driven depending on an electromagnetic force of the electromagnetic coil; and
a body portion that is in contact with the fixed core and slidably holds the valve, and
a distal end of the heat-conducting portion extended to the electric actuator is adjacent to the fixed core.

2. The driver according to claim 1, wherein
a distal end of the heat-conducting portion extended to the electric actuator is adjacent to a component of the electric actuator to be cooled.

3. The driver according to claim 1, wherein
the electric actuator controls a hydraulic oil to be used in an onboard device, and
a distal end of the heat-conducting portion extended to the electric actuator is adjacent to a component of the electric actuator to be cooled by the hydraulic oil.

4. The driver according to claim 1, wherein
the heat-conducting portion comprises:
a first part that mounts the driver circuit and extends in an axial direction of the electric actuator; and
a second part that extends from one end of the first part in a direction crossing an axis of the electric actuator.

5. The driver according to claim 4, wherein
the second part of the heat-conducting portion is thicker than the first part of the heat-conducting portion.

6. The driver according to claim 4, wherein
the heat-conducting portion further comprises a third part that extends from one end of the second part in the axial direction of the electric actuator.

7. The driver according to claim 4, further comprising
a metal block that is adjacent to the first part and the second part of the heat-conducting portion.

8. The driver according to claim 1, wherein
the electric actuator further comprises a bobbin which is inserted through the fixed core and around which the electromagnetic coil is wound, and
the sealing portion is formed integrally with the bobbin.

9. The driver according to claim 1, wherein
the electric actuator further comprises a bobbin which is inserted through the fixed core and around which the electromagnetic coil is wound,
the sealing portion is in contact with the bobbin and the fixed core, and
thermal conductivity of the sealing portion is higher than thermal conductivity of the bobbin.

10. The driver according to claim 1, further comprising
at least one external wiring terminal that is connected to an external wiring through which a control signal of the driver circuit propagates or at least one electromagnetic coil terminal that is connected to the electromagnetic coil,
wherein the heat-conducting portion is integrated with the at least one external wiring terminal or the at least one electromagnetic coil terminal.

11. The driver according to claim 10, wherein
the at least one external wiring terminal or the at least one electromagnetic coil terminal which is integrated with the heat-conducting portion, is thicker than the at least one external wiring terminal or the at least one electromagnetic coil terminal that is not integrated with the heat-conducting portion.

12. The driver according to claim 4, wherein
the heat-conducting portion further comprises a fourth part that extends from another end of the first part in a direction crossing the axis of the electric actuator and is adjacent to a housing of the electric actuator.

13. A driver comprising:
a driver circuit that controls a current to be supplied to an electric actuator;
a heat-conducting portion that conducts heat generated in the driver circuit; and
a sealing portion that is fixed to the electric actuator and seals the driver circuit and the heat-conducting portion,
wherein the heat-conducting portion is extended to the electric actuator,
wherein the heat-conducting portion mounts the driver circuit, and
the heat-conducting portion comprises a shielding wall that shields an electromagnetic wave from outside of an electromagnetic coil of the electric actuator.

14. A driver comprising:
a driver circuit that controls a current to be supplied to an electric actuator;
a heat-conducting portion that conducts heat generated in the driver circuit; and
a sealing portion that is fixed to the electric actuator and seals the driver circuit and the heat-conducting portion,
wherein the heat-conducting portion is extended to and in contact with the electric actuator.

15. The driver according to claim 14, further comprising a dissimilar member that is arranged between the heat-conducting portion and the driver circuit and represents a member made of a different material from the seal portion.

16. The driver according to claim 15, further comprising a bonding wire that is buried in the dissimilar member and electrically connected to the driver circuit.

17. The driver according to claim 14, further comprising:
a base on which the driver circuit is mounted; and
a dissimilar member that is arranged between the base and the heat-conducting portion and represents a member made of a different material from the seal portion.

18. The driver according to claim 14, wherein
the electric actuator comprises:
a coil bobbin that is constituted by an electromagnetic coil and a bobbin around which the electromagnetic coil is wound;
a fixed-core portion that holds the coil bobbin;
a valve that is driven depending on an electromagnetic force of the electromagnetic coil;
a valve portion that holds the valve; and
an electric actuator housing that holds the coil bobbin, the fixed-core portion, the valve, and the valve portion,
wherein the heat-conducting portion is in contact with the valve portion.

19. The driver according to claim 14, wherein
the heat-conducting portion is surface-treated.

20. The driver according to claim 14, wherein
the heat-conducting portion comprises a metal shielding wall that covers the driver circuit.

21. The driver according to claim 14, wherein
the heat-conducting portion comprises an externally-exposed portion that is exposed to outside of the sealing portion.

22. The driver according to claim 21, wherein
the electric actuator controls a fluid passing through a flow path provided in a metal housing, and
the externally-exposed portion is connected to the metal housing via a heat-dissipating member.

23. The driver according to claim 14, further comprising a base on which the driver circuit is mounted,
wherein the base is in contact with the electric actuator.

* * * * *